United States Patent [19]

Desurvire et al.

[11] Patent Number: 4,738,503

[45] Date of Patent: Apr. 19, 1988

[54] IN-LINE FIBER OPTIC MEMORY

[75] Inventors: Emmanuel Desurvire, Menlo Park; Michel J. F. Digonnet, Palo Alto; Herbert J. Shaw, Stanford, all of Calif.

[73] Assignee: The Board of Trustees of the Leland Stanford Junior University, Stanford, Calif.

[21] Appl. No.: 828,782

[22] Filed: Feb. 12, 1986

Related U.S. Application Data

[63] Continuation-in-part of Ser. No. 699,853, Feb. 2, 1985, now Defensive Publication No. 4,708,421.

[51] Int. Cl.[4] .............................................. G02B 5/172
[52] U.S. Cl. .............................. 350/96.15; 350/96.16
[58] Field of Search ............... 350/96.15, 96.16, 96.18, 350/96.20, 96.21, 96.30

[56] References Cited

U.S. PATENT DOCUMENTS

| | | | |
|---|---|---|---|
| 4,136,929 | 1/1979 | Suzaki | 350/96.15 |
| 4,401,364 | 8/1983 | Mochizuki | 350/96.16 |
| 4,469,397 | 9/1984 | Shaw et al. | 350/96.15 |
| 4,473,270 | 9/1984 | Shaw | 350/96.15 |
| 4,493,528 | 1/1985 | Shaw et al. | 350/96.15 |
| 4,530,097 | 7/1985 | Stokes et al. | 350/96.15 X |
| 4,536,058 | 8/1985 | Shaw et al. | 350/96.15 X |
| 4,556,279 | 12/1985 | Shaw et al. | 350/96.15 |

FOREIGN PATENT DOCUMENTS 0104943 4/1984 European Pat. Off. .
0139387 5/1985 European Pat. Off. .

OTHER PUBLICATIONS

R. H. Stolen, "Fiber Raman Lasers", *Fiber and Integrated Optics*, vol. 3, No. 1, 1980.
R. H. Stolen, "Active Fibers", *New Directions in Guided Wave and Coherent Optics*, vol. 1, Martinus Nijhoff Publishers, Boston, 1984.
R. G. Smith, "Optical Power Handling . . . Brillouin Scattering", *Applied Optics*, vol. 11, No. 11, Nov. 1972, pp. 2489–2494.
Dakss et al., "Amplified Spontaneous Raman Scattering and Gain in Fiber Raman Amplifiers", *J. of Lightwave Technology*, vol. LT-3, No. 4, 8/85, pp. 806–813.
D. Cotter, "Observation of Stimulated Brillouin Scattering . . . ", *Electronic Letters*, vol. 18, No. 12, pp. 495–496, 1982.
Aoki et al., "Bit Error Rate Evaluation of Optical . . . in an Optical Fibre", *Electronics Letters*, vol. 21, No. 5, Feb. 28, 1985, pp. 191–193.
Mollenauer et al., "Experimental Demonstration of Soliton . . . by Raman Gain", *Optics Letters*, vol. 10, No. 5, May 1985, pp. 229–231.

(List continued on next page.)

*Primary Examiner*—Eugene R. LaRoche
*Assistant Examiner*—Steven J. Motola
*Attorney, Agent, or Firm*—Knobbe, Martens, Olson & Bear

[57] ABSTRACT

A fiber optic recirculating memory comprises a splice-free length of optical fiber which forms a loop that is optically closed by means of a fiber optic coupler. The coupler couples an optical signal input pulse to the loop for circulation therein, and outputs a portion of the signal pulse on each circulation to provide a series of output pulses. A pump source is included to pump the fiber loop with a pump signal having sufficient intensity to cause stimulated Raman scattering in the fiber loop, and thereby cause amplification of the circulating signal pulse. The fiber characteristics, coupler characteristics, and a pump power are selected to yield a Raman gain which compensates for the total round-trip losses in the fiber loop, so as to provide an output pulse train of constant amplitude pulses. The invention may be implemented utilizing a standard coupler with a pump signal modulation technique. The pump signal is input to the loop as a series of pulses having a duration and a periodicity chosen to prevent overlap of recirculating pump pulses with input pump pulses until at least two circulations of the loop, which minimizes pump power fluctuations and will therefore enhance output signal stability.

11 Claims, 8 Drawing Sheets

OTHER PUBLICATIONS

Tur et al., "Laser Phase Noise Effects in Fiber Optic Signal Processors with Recirculating Loops", Conference on Lasers and Electro-Optics, 1983.

Tur et al., "Phase Noise Effects in Recirculating Delay Lines Driven by Semiconductor Lasers", OFC, 1983.

Chinlon Li, et al., "A Tunable 1.1-$\mu$m Fiber Raman Oscillator," Applied Physics Letters, vol. 31, No. 2, Jul. 15, 1977, pp. 97–99.

John Auyeung, et al., "Spontaneous and Stimulated Raman Scattering in Long Low Loss Fibers," IEEE Journal of Quantum Electronics, vol. QE-14, No. 5, May 1978, pp. 347–352.

R. H. Stolen, et al., "A Fiber Raman Ring Laser," IEEE Journal of Quantum Electronics, vol. QE-14, No. 11, Nov. 1978, pp. 860–862.

Rogers H. Stolen, "Polarization Effects in Fiber Raman and Brillouin Lasers," IEEE Journal of Quntum Electronics, vol. QE-18, No. 10, Oct. 1979, pp. 1157–1160.

Bergh, et al., "Single-Mode Fiber Optic Directional Coupler," Electroics Letters, vol. 16, No. 7, Mar. 27, 1980, pp. 260–261.

Ikeda, M., "Stimulated Raman Amplification Characteristics in Long Span Single-Mode Silica Fibers," Optics Communications, vol. 39, No. 3, Oct. 1, 1981, pp. 148–152.

S. A Newton, et al., "Single Mode Fiber Recirculating Delay Line," SPIE Conference, Jan. 1982, paper 325-21 (8 pages).

J. E. Bowers, et al., "Filter Response of Single-Mode Fibre Recirculating Delay Lines," Electronics Letters, vol. 18, No. 3, Feb. 4, 1982, pp. 110–111.

Digonnet, et al., "Analysis of a Tunable Single Mode Optical Fiber Coupler," IEEE Journal of Quantum Electronics, vol. QE-18, No. 4, Apr. 1982, pp. 746–753.

L. F. Stokes, et al., "All-Single-Mode Fiber Resonator," Optics Letters, vol. 7, No. 6, Jun. 1982, pp. 288–290.

L. F. Stokes, et al., "All-Fiber Stimulated Brillouin Ring Laser with Submilliwatt Pump Threshold," Optics Letters, vol. 7, No. 10, Oct. 1982, pp. 509–511.

Koepf, et al., "Raman Amplification at 1.118 $\mu$m in Single-Mode Fibre and Its Limitation by Brillouin Scattering," Electronics Letters, vol. 18, No. 22, Oct. 28, 1982, pp. 942–943.

Ohashi, et al., "Phase-Matched Light Amplification by Three-Wave Mixing Process in a Birefringent Fiber due to Externally Applied Stress," Applied Physics Letters, vol. 41, No. 12, Dec. 15, 1982, pp. 1111–1113.

M. Tur, et al., "Spectral Structure of Phase-Induce Intensity Noise in Recirculating Delay Lines," SPIE 1983.

Michel Digonnet, et al., "Wavelength Multiplexing in Single-Mode Fiber Couplers," Applied Optics, vol. 22, No. 3, Feb. 1, 1983, pp. 484–491.

S. A. Newton, et al., "High-Speed Pulse-Train Generation using Single-Mode-Fibre Recirculating Delay Lines," Electronics Letters, vol. 19, No. 19, Sep. 15, 1983, pp. 756–758.

L. F. Mollenauer, et al., "The Soliton Laser," Optics Letters, vol. 9, No. 1, Jan. 1984, pp. 13–15.

Nakazawa, et al., "Active Transmission Line: Light Amplification by Backward-Stimulated Raman Scattering in Polarization-Maintaining Optical Fiber," Journal Optical Society of America B, vol. 1, No. 1, Mar. 1984, pp. 80–85.

A. R. Chraplyvy, et al., "Synchronously Pumped $D_2$ Ga-In-Glass Fiber Raman Laser Operating at 1.56 $\mu$m," Optics Letters, vol. 9, No. 6, Jun. 1984, pp. 241–242.

Pocholle, et al., "Nonlinear Optical Amplification in Single-Mode Fibers: Potential Applications to Optical Communications Systems," Conference on Lasers and Electro Optics, paper FR1, Jun. 22, 1984.

M. Nakazawa, "Optical Amplification by Raman Effect in Silica Fiber," Conference on Lasers and Electro Optics, paper FR2, Jun. 22, 1984.

R. H. Stolen, et al., "Development of the Stimulated Raman Spectrum in Single-Mode Silica Fibers,: Journal of the Optical Society of America B., vol. 1, No. 4, Aug. 1984, pp. 652–657.

Bingkun Zhou, et al., "Efficient, Frequency-Stable Laser-Diode-Pumped Nd:YAG Laser," Optics Letters, vol. 10, No. 2, Feb. 1985, pp. 62–64.

Desurvire, et al., "Raman Amplification of Recirculating Pulses in a Reentrant Fiber Loop," Optics Letters, vol. 10, No. 2, Feb. 1985, pp. 83–85.

Moshe Tur, et al., "Theory of Laser Phase Noise in Recirculating Fiber-Optic Delay Lines," IEEE Journal of Lightwave Technology, vol. LT-3, No. 1, Feb. 1985, pp. 333–342.

E. Desurvire, et al., "Raman Amplification in a Single-Mode Reentrant Fiber Loop," presented at the Third International Conference on Optical Fiber Sensors, Feb. 13–14, 1985, San Diego, California, paper WBB5.

Masataka Nakazawa, "Synchronously Pumped Fiber Raman Gyroscope," Optics Letters, vol. 10, No. 4, Apr. 1985, pp. 193–195.

J. P. Pocholle, et al., "Raman and Four Photon Mixing Amplification in Single Mode Fibers," Optical Engineering, vol. 24, No. 4, Jul./Aug. 1985, pp. 600–608.

W. V. Sorin, et al., "Single-Mode-Fiber Ring Dye Laser," Optics Letters, vol. 10, No. 11, Nov. 1985, pp. 550–552.

M. J. F. Digonnet, et al., "Theoretical Analysis of Optical Fiber Laser Amplifiers and Oscillators," Applied Optics, vol. 24, No. 3, Feb. 1, 1985, pp. 333–342.

"Raman Oscillation in Glass Optical Waveguide", Stolen, et al., Applied Physics Letters, vol. 20, No. 2, Jan. 15, 1972, pp. 62–64.

"Low-Threshold CW Raman Laser", Hill, et al., Applied Physics Letters, vol. 29, No. 3, Aug. 1, 1976, pp. 181–183.

"Fiber Raman Lasers", Stolen, NATO Summer Inst. on Fiber and Integrated Optics, Cargese, France, Jun. 1978, pp. 1–17.

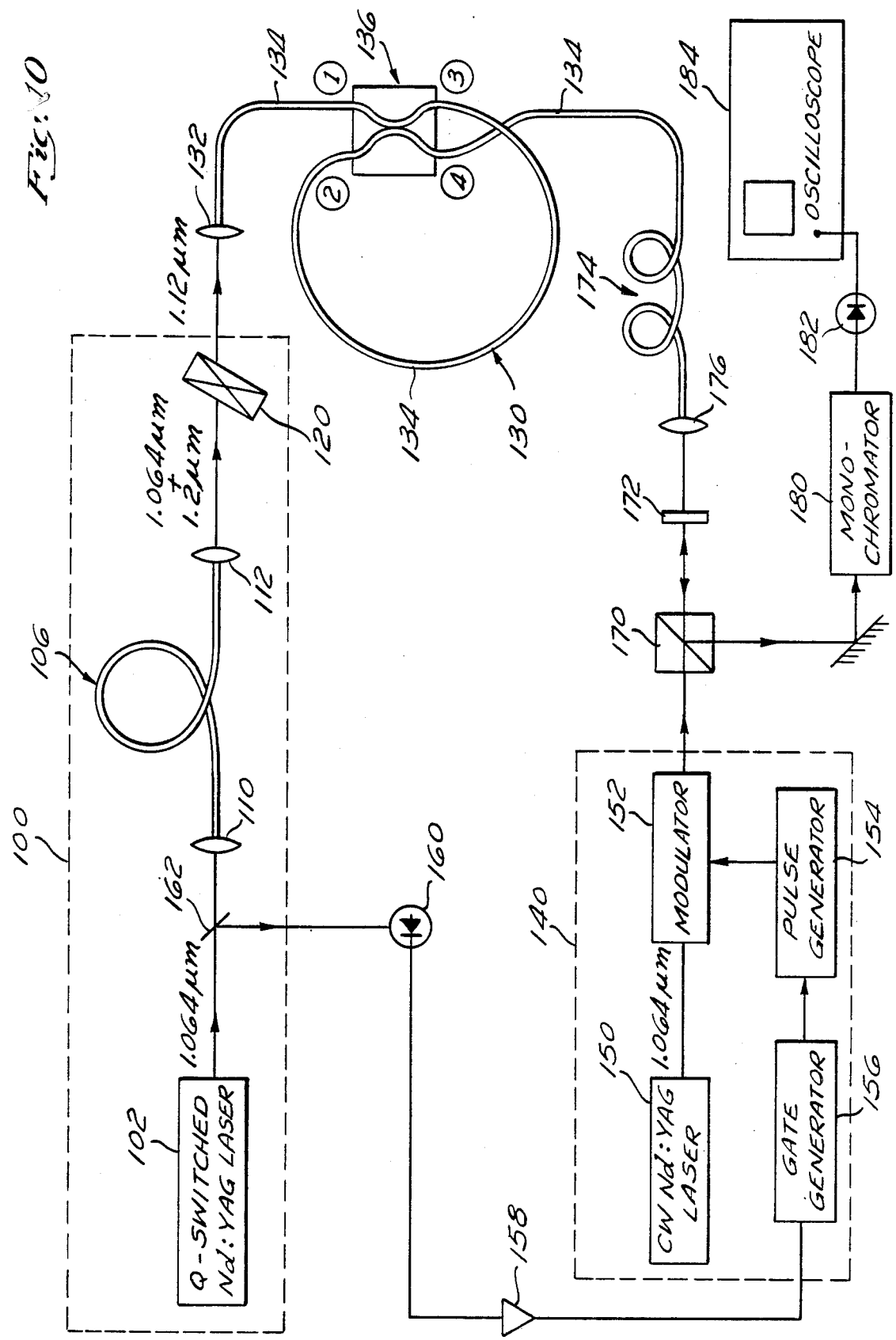

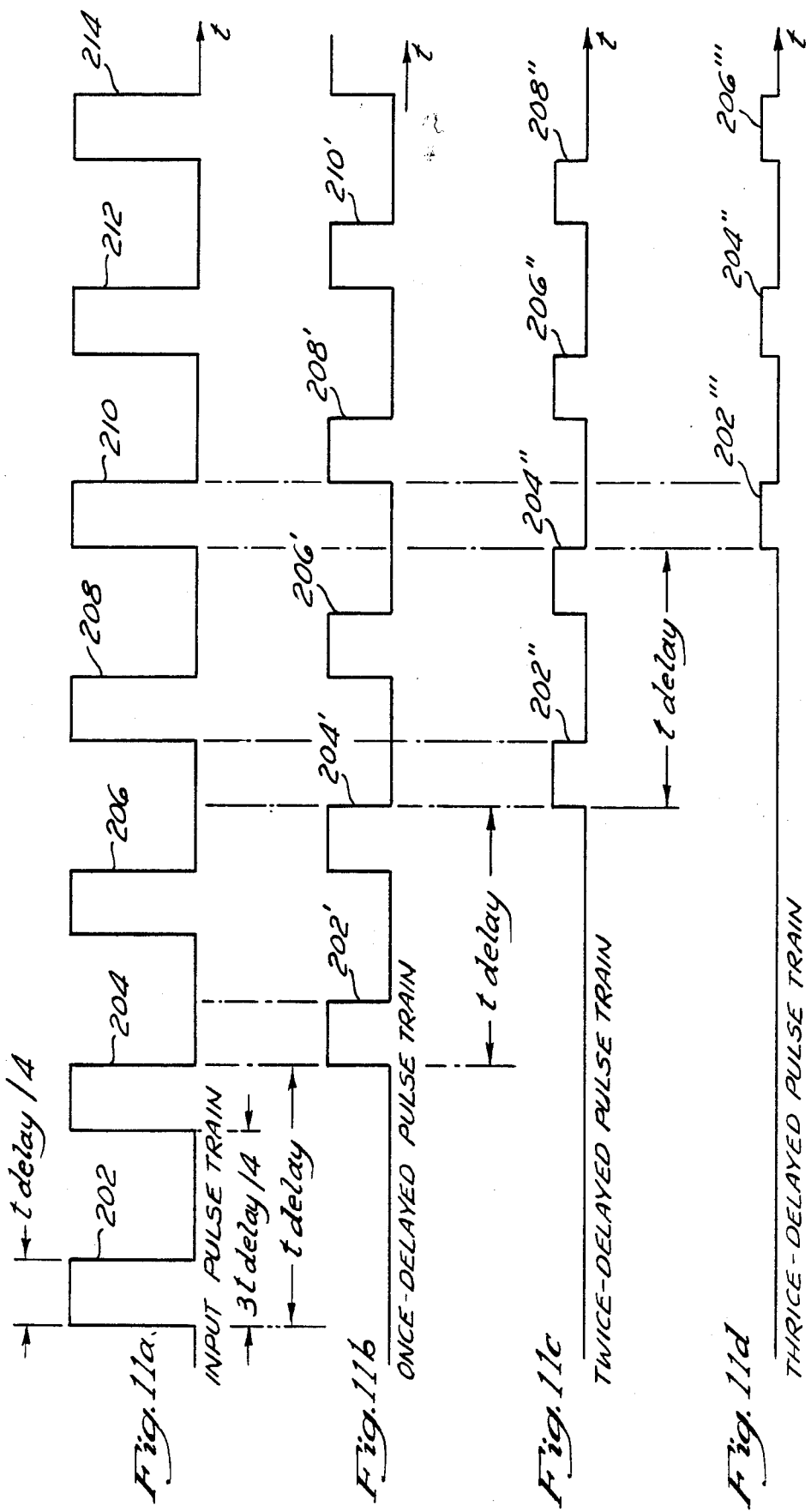

IN-LINE FIBER OPTIC MEMORY

CROSS-REFERENCE TO OTHER APPLICATIONS

This application is a continuation-in-part application of pending U.S. Application Ser. No. 699,853, filed on Feb. 2, 1985, now U.S. Pat. No. 4,708,421 issued 11-24-87 which is incorporated herein by reference.

BACKGROUND OF THE INVENTION

The present invention relates generally to fiber optic optical memory devices, and particularly to in-line fiber optic memories which recirculate optical signals, and which utilize non-linear effects for amplification of the recirculating signals.

Fiber optic recirculating memories typically comprise a loop of optical fiber and a fiber optic directional coupler for coupling light to and from the loop of optical fiber. An exemplary fiber optic recirculating memory is disclosed in U.S. Pat. No. 4,473,270, issued Sept. 25, 1984, which is incorporated by reference herein. As disclosed in that patent, a single signal pulse is supplied as an input to the memory device. This pulse recirculates in the loop and a portion of the pulse is coupled out of the loop on each circulation to provide a series of output signal pulses identical to the input signal pulse, although at smaller, gradually decreasing amplitudes. Such a device is particularly useful, for example, to provide a short term optical memory in a system where data is generated at a rate faster than it can be accepted by a data processor, or to adjust time delays between systems exchanging data (optical delay line) or to repeat data (data regeneration). This device may also be utilized as a pulse train generator, or as a filter. Moreover, recirculating memory devices may be utilized as reentrant fiber sensing loops for fiber optic gyroscopes.

Although the recirculating memory disclosed in the above-referenced patent represents a significant advance in the art, and is quite advantageous for many optical memory applications, the optical memory capabilities of such devices are limited due to the fact that the circulating signal pulse is degraded by coupling a portion of this pulse on each circulation around the fiber loop to provide the train of output pulses. Further, fiber propagation losses attenuate the optical signal pulse as it propagates through the loop, causing additional losses. These losses cause the intensity of the signal pulse circulating in the loop to decay, which causes a concomitant decay in the series of output pulses, thereby limiting the number of useable output pulses and the lifetime of the optical signal memory.

In order to prevent the problems associated with decay of the circulating pulse, it has been proposed in the prior art to insert a fiber optic amplifier in the loop so as to amplify the pulse on each circulation to compensate for the loop losses. Such a system, for example, has been disclosed in U.S. Pat. No. 4,136,929, to Suzaki, entitled "Apparatus for Generating Light Pulse Train". Fiber optic amplifiers, however, are typically discrete components, which must be spliced into the fiber loop. Such splicing will cause additional loop losses which must be compensated for by the fiber optic amplifier.

Accordingly, there is a need in the art for a low loss in-line recirculating optical memory which utilizes an amplification process capable of providing sufficient gain to compensate for the total round trip loop losses.

SUMMARY OF THE INVENTION

The present invention is an in-line fiber optic recirculating memory having a length of optical fiber, preferably splice-free, for receiving an optical signal pulse. The splice-free optical fiber forms a loop which is optically closed by means of an optical coupler, for example, a fiber optic directional coupler. The coupler couples the optical signal input pulse to the loop for circulation therein, and outputs a portion of the signal pulse on each circulation to provide a series of output pulses.

The optical memory of the present invention also includes a pump source for pumping the fiber loop with a pump signal having sufficient intensity to cause gain, for example, Raman gain caused by stimulated Raman scattering (SRS), in the core of the fiber. Preferably, the optical fiber forming the loop is single mode fiber, which typically has a core diameter on the order of 5-10 microns. The small core diameter of single mode fiber is highly advantageous over the larger core diameter of multimode fiber, since its small size provides increased optical power density in the fiber core for a given amount of pump light, and thus increases the optical gain.

In the preferred embodiment, the pump source has a coherence length which is short compared to the length of the fiber loop to ensure that any of the pump light that recirculates in the loop does not cause a resonant effect. Further, the pulse width of the signal pulse is preferably less than the loop length to ensure that the signal pulse does not interfere with itself while circulating in the loop.

Stimulated Raman scattering may be viewed as a three level laser emission process in which molecules of the active media (i.e., the fiber core) are excited from the ground level to an excited virtual level by absorbing input pump photons. Return of the excited molecules to an intermediate level results in the emission of photons, commonly referred to as "Stokes photons". These Stokes photons have a frequency downshifted with respect to the pump frequency by a characteristic amount, typically referred to as the Raman shift. In the case of SRS in a fused silica fiber, the Stokes photons have a frequency which is about 13-15 terahertz (THz) below the frequency of the pump light. In addition to the emission of Stokes photons, the transition from the intermediate level back to the ground level results in the emission of phonons. However, such phonons are of little interest in the present invention, as they are quickly absorbed by the fiber and converted to heat.

In the present invention, the input signal pulse has a wavelength which is equal to the Stokes wavelength. When the signal pulse is injected into the fiber loop, such pulse will stimulate relaxation of the excited molecules and emission of photons at the Stokes wavelength. These stimulated photons have the same phase characteristics and frequency as the input signal pulse, and thus, provide coherent amplification of the input signal pulse.

The optical gain, and thus, the amount of amplification, depends upon the gain coefficient of the fiber ($g$); the optical power $P_{pc}$ of the input pump signal; the effective interaction area ($A_f$) of the optical fiber (i.e., the area of mode or electromagnetic field overlap between the signal pulse and the pump signal); and the effective interaction length ($L_f$) of the fiber loop (i.e., the calculated length, less than the loop length, which accounts for pump power attenuation along the fiber loop). In addition, it has been found that for the above-described recirculating memory configuration, the gain is also dependent upon the attenuation ($\alpha$) of the fiber, the length (L) of the fiber loop, and the coupling ratio ($\eta$) of the coupler. These recirculating memory device parameters are coordinated in the present invention so that the gain provided by pumping the fiber compensates for the total round trip losses in the fiber loop. This loss compensation, therefore, provides an output pulse train of substantially constant amplitude pulses.

The invention may be implemented utilizing either an ordinary "standard" coupler or a specifically adapted "multiplexing coupler". The term "standard coupler" as used herein, refers to a coupler in which the coupling ratio for the input signal pulse is close to that of the pump signal, such that the coupling ratios differ by no more than 0.2. Conversely, a "multiplexing coupler" is a coupler which exhibits a sizeable difference in coupling ratio for the pump signal and signal pulse, such that the difference in coupling ratios is greater than 0.2. For a given input pump power, there is a set of coupling ratios for the pump signal and signal pulse which supplies the loop with the exact amount of pump power required to produce just enough gain to offset total round trip losses of the signal pulses such that the output pulses will have a constant amplitude.

If a standard coupler is used and it is tuned to have relatively high coupling ratios, the total round trip loop losses will be advantageously low thereby decreasing the amount of amplification or gain necessary to compensate for them. However, very little pump power will be launched into the loop, so that pump power utilization is quite inefficient. If, on the other hand, a standard coupler tuned to relatively low coupling ratios is used, a sizeable fraction of the pump power will be launched into the loop, so that the pump power is used efficiently to provide gain. However, a major fraction of the circulating pulse will be coupled out on each circulation, so that the total round trip loop losses will be quite high. Thus, if the coupler is set to yield high gain, the loop losses will be high, while, if the coupler is set for low losses, the gain will be low. Accordingly, there exists an optimum set of coupling ratios corresponding to a specific coupler tuning which minimizes the pump power required for compensation of total round trip losses. It has been observed however that with such mode of operation (i.e., using a standard coupler with a relatively high pump coupling ratio) the recirculation and interference of pump power in the loop causes enhanced pump power fluctuations or noise which in turn cause gain fluctuations and thus sizeable signal intensity noise. These fluctuations are due to interference between the recirculating pump electromagnetic fields of short coherence time and are commonly referred to as a phase noise effect.

As indicated above, a multiplexing coupler may be utilized, rather than a standard coupler. Preferably, the multiplexing coupler is formed to have a large interaction length. There exists then a tuning position for the coupler for which the interaction length is substantially equal to an even number of coupling lengths for the pump signal and substantially an odd number of coupling lengths for the signal pulse, so that the coupling ratio for the pump signal is zero, or close to zero, while the coupling ratio for the signal pulse is close to unity, but not exactly unity. A coupling ratio of zero for the pump signal makes it possible to utilize the entire amount of input pump power and thereby provides for maximum possible gain, while a couplling ratio close to unity (but not exactly unity) for the signal pulse provides for minimum round trip loop loss. Such combination of coupling ratios permits the invention to operate at very low input pump signal power, while still providing the proper amount of gain. In addition, the use of a zero or null pump coupling ratio suppresses the effect of pump power recirculation, which, due to phase noise, would cause gain fluctuations in the loop.

The invention may be implemented in either a forward configuration in which the pump signal and signal pulse are both input into the same end of the fiber loop such that the signal pulse propagates in the same direction around the loop as the pump signal, or it may be implemented in a backward configuration in which the pump signal and signal pulse are input into opposite ends of the loop, so that the signal pulse propagates in a direction opposite that of the pump signal. In the preferred embodiment, a backward configuration is utilized, since it has been found that this advantageously averages out the effect of pump fluctuation frequencies (i.e., those larger than the reciprocal of the loop transit time) on the signal amplitude fluctuations.

The present invention suppresses the effects of phase noise, and thus, minimizes the signal intensity noise while using a coupler having a pump coupling ratio substantially greater than zero, such that the pump power is recirculated in the loop.

In the preferred embodiment of the invention, the pump signal is input to the recirculating loop as a series or train of pump pulses having a selectable pulse width and a selectable delay between the beginning of each successive input pump pulse. The pulse width and delay are selected so that each input pump pulse makes plural circulations in the fiber loop before overlapping with any subsequent pump pulse in the series of pump pulses. This allows the amplitude of the recirculating pump pulses to decay before overlapping occurs and thus reduces the effect of their mutual interference. The pump power recirculating in the loop is thereby stabilized causing a sizeable reduction of gain noise, which in turn effects a drastic reduction of the amplified signal noise. Therefore, the invention improves the output signal stability when using a non-zero pump coupling ratio, such as exists in the above discussed standard coupler.

DESCRIPTION OF THE DRAWINGS

These and other aspects of the present invention may be more fully understood through reference to the drawings in which:

FIG. 10 is a schematic drawing of an alternative embodiment which provides the pump signal as a series of pulses to the recirculating loop to reduce phase noise.

FIGS. 11a, 11b, 11c and 11d are graphs of a pump input pulse train, a train of once-delayed pump pulses, a train of twice-delayed pump pulses, and a train of thrice-delayed pump pulses, respectfully, showing the timing relationships between the pulse trains in the embodiment of FIG. 10.

DESCRIPTION OF THE PREFERRED EMBODIMENTS

Figure 1:
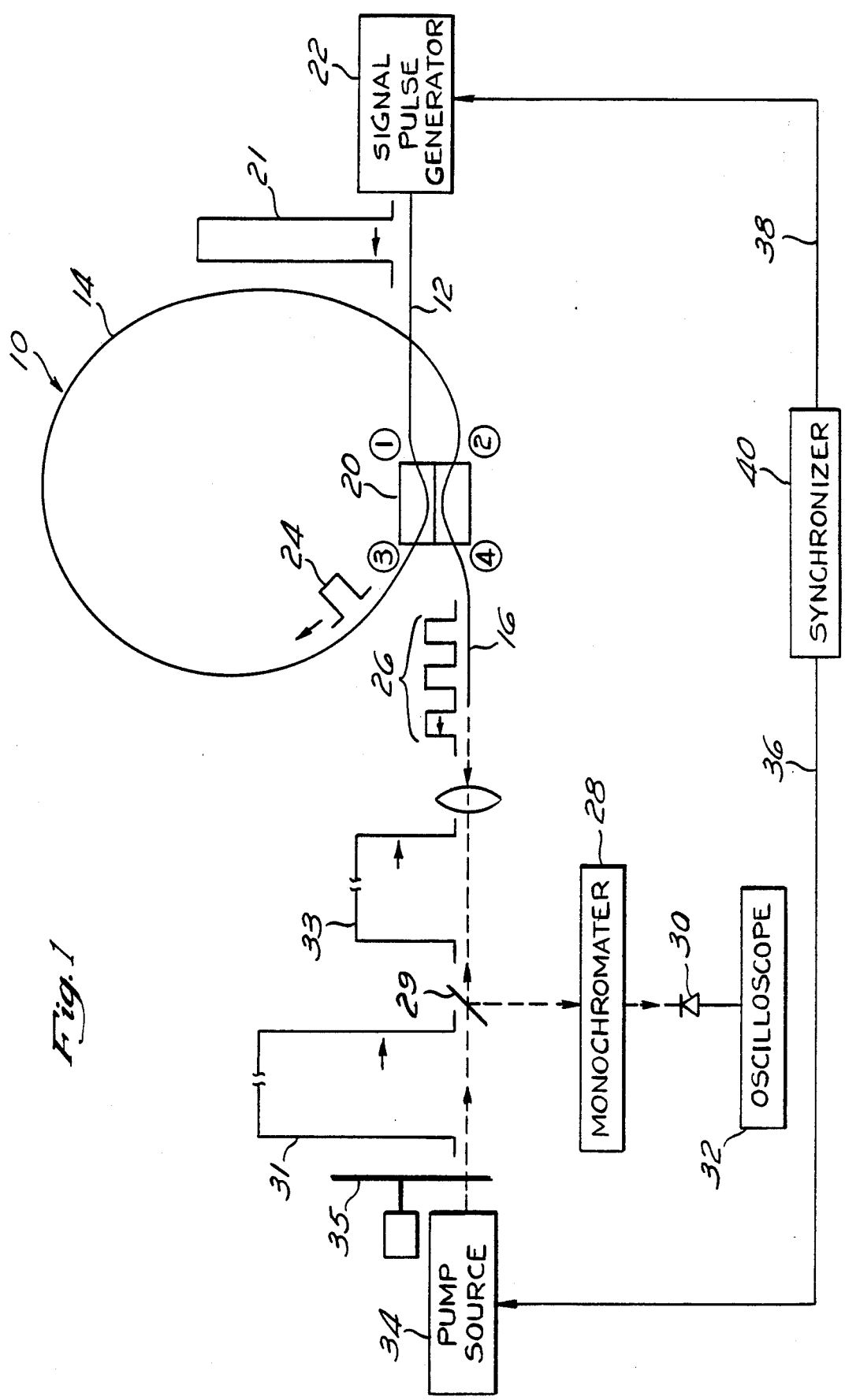
FIG. 1 is a schematic drawing of an embodiment of the optical memory of the present invention showing a signal pulse generator for introducing a signal pulse into the fiber loop, and a pump source for introducing a pump signal into the fiber loop to cause Raman gain to amplify the signal pulse.

As shown in FIG. 1, the optical memory of one embodiment of the present invention comprises a continuous, uninterrupted strand 10 of optical fiber, preferably single-mode optical fiber, having an input end portion 12, a loop portion 14, and an output end portion 16. At the ends of the loop portion 14, the single-mode fiber 10 is optically coupled together by means of a fiber optic, evanescent field, four port, directional coupler 20, having ports 1 and 2 on one side thereof, and ports 3 and 4 on the other side thereof. Tracing the fiber 12 from one end to the other, the fiber 10 first passes through ports 1 and 3, and then through ports 2 and 4, so that the loop 14 extends from ports 3 and 2, while the input portion 12 extends from port 1, and the output portion 16 extends from port 4.

A signal pulse generator 22 is provided to selectively introduce an input pulse 21 into the input fiber portion 12. The coupler 20 couples a portion 24 of this pulse 21 to the loop 14 for recirculation therein. Each time the pulse 24 circulates in the loop, a portion is output through the output fiber portion 16 to provide a series or train of output pulses 26. These output pulses 26 are directed through a lens 27 to a beam splitter 29 which splits the output pulses 26 and directs a portion through a monochromator 28 to suppress Fresnel reflections and scattered pump light, so as to filter the output signal pulses 26. After filtering by the monochromator 28, the output signal pulses 26 may be directed to a detector 30 which converts the optical signals to electrical signals for display on an oscilloscope 32. Those skilled in the art will recognize that a spike filter at the wavelength of the optical signal pulses 26 (or a dispensive element such as a prism or grating) may be substituted for the monochromator 28.

The embodiment of FIG. 1 also includes a pump source 34 for producing a pump light signal 31. In the embodiment shown in FIG. 1, the signal 31 is a pulse having a width which is at least as long as the desired length of the output pulse train 26. In other words, the pump pulse 31 should have a duration which is at least as long as the desired number of output pulses times the loop transit time. In one particular embodiment of FIG. 1, the duration of the pulse 31 is selected to be at least 50 times the loop transit time so as to yield at least 50 substantially identical output pulses 26. The pump source 34 of the embodiment of FIG. 1 comprises a continuous wave Nd:YAG laser having a CW power of 2 watts and a wavelength of 1.064 microns. A chopper 35 is included at the output of the pump source 34 to chop the pump signal into relatively long pulses (e.g., 0.5 msec). As is well known in the art, a chopper typically comprises a rotating disk having apertures to alternately block and pass the output light of a laser at a specific frequency. Those skilled in the art will recognize that an acousto-optic or electro-optic modulator may be used instead of the chopper 35.

The pump signal 31 is directed from the pump source 34 to the beam splitter 29, where the light is split such that one portion (not shown) is directed to the monochromator 28, and the other portion 33 is directed to the lens 27 for introduction into the output end portion 16 of the fiber 10 for propagation through the loop 14. The signal portion 33 in the end portion 16 will be referred to as the "input pump signal." The filter characteristics of the monochromator 28 are selected so that the portion of the pump signal directed towards the monochromator 28 will be blocked to prevent it from reaching the detector 30.

The pump source 34 and signal pulse generator 22 are connected by respective lines 36, 38 to a synchronizer 40. The synchronizer 40 synchronizes the chopped pump signal pulses to the signal pulses from the pulse generator 22, such that the pump light enters the loop 14 just prior to the signal pulses so that the pump light is present in the loop when the signal pulses arrive.

Preferably, the coherence length of the pump source 34 is relatively short compared to the length of the fiber loop 14 to ensure that any of the pump light that recirculates in the loop 14 does not interfere with itself. Further, the width of the signal pulse 21 produced by the generator 22 should preferably be less than the length of the fiber loop to ensure that the circulating pulse 24 does not interfere with itself as it circulates through the loop 14.

The wavelength and amplitude of the input pump signal 33 are selected to cause stimulated scattering in the fiber loop 14 at the pulse signal wavelength. As discussed in more detail hereinafter, such stimulated scattering produces photons at a wavelength referred herein as the "Stokes wavelength". In the case of stimulated Raman scattering in silica glass fibers, the Stokes wavelength is 1.12 microns for a pump wavelength of 1.064 microns. The photons produced by this stimulated scattering amplify the circulating pulse 24 as it propagates around the fiber loop 14. However, for such amplification to occur, it is important that the signal pulse 21 (and the circulating pulse 24) be at a wavelength equal to the Stokes wavelength.

Figure 2:
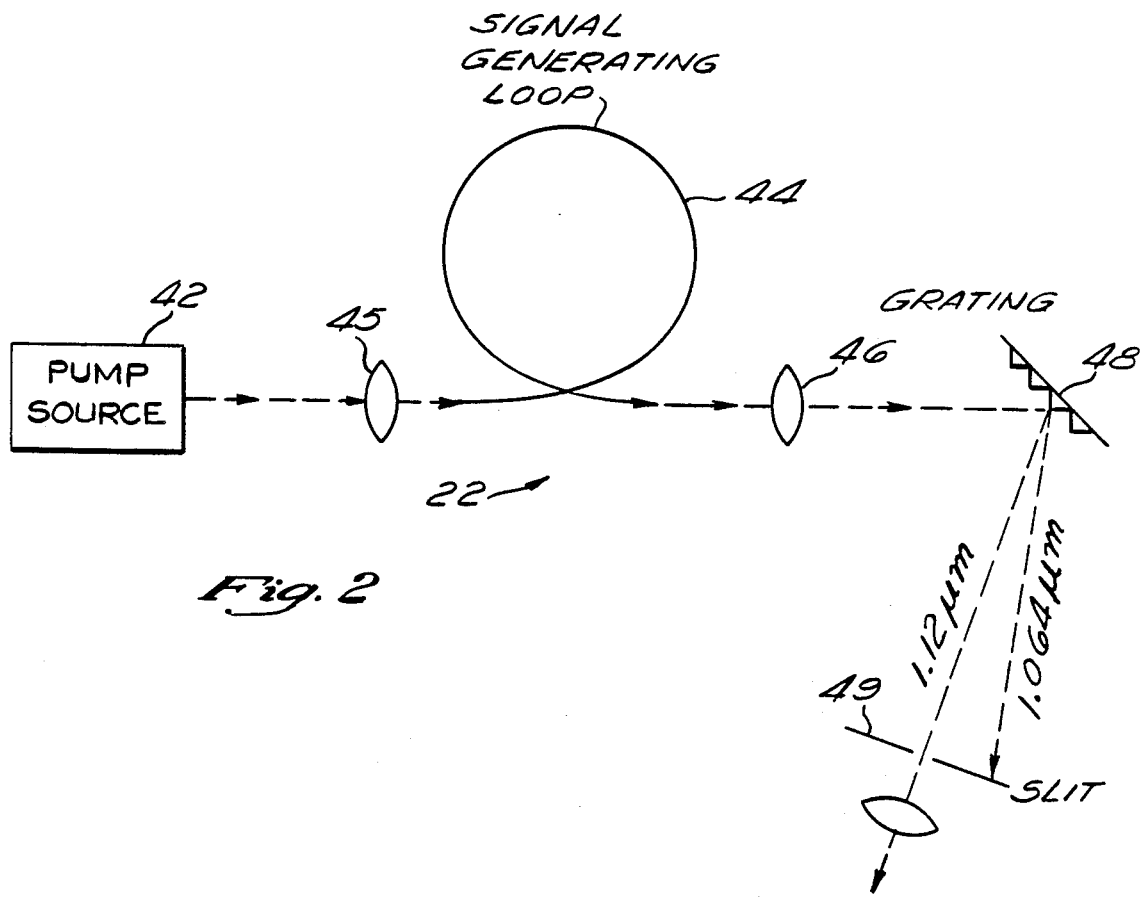
FIG. 2 is a schematic drawing of an embodiment of the signal pulse generator of FIG. 1.

To insure that the signal wavelength is the same as the Stokes wavelength, the signal pulse generator 22 comprises a laser 42 which produces light at a wavelength identical to that of the pump source 34 (e.g., 1.064 microns), and a signal generating loop 44, formed of the same type of fiber as the loop 14, as shown in FIG. 2. By way of example, the laser 42 may be a Q-switched Nd:YAG laser having an output wavelength of 1.064 microns, a peak power of 120 watts and a switching rate of 50 Hz, so as to generate relatively thin (500 nsec) high power pump pulses which are widely spaced (e.g., a spacing greater than the pump signal duration). By way of example, the loop 44 may have a length of about 1 km. The light from the source 42 is input to one end of the loop 44 through a lens 45 to generate stimulated scattering in the loop 44 such that a wave having the Stokes wavelength of e.g. 1.12 microns is output, together with the pump light, at the other end of the fiber. The Stokes wave and the pump light are then directed through a lens 46 to a diffraction grating 48 which separates the two wavelengths into two diverging rays. A diaphragm 49 with a slit therein is positioned to block the 1.064 micron pump light, but pass the 1.12 micron Stokes light to provide the signal pulse 21 (FIG. 1) which is input to the input end portion 12 of the fiber 10 (FIG. 1) through a lens 41. Thus, the signal pulse generator 22 provides signals at exactly the same optical wavelength as the Stokes light generated in the fiber loop 14 (FIG. 1).

Those skilled in the art will recognize that a simpler set up may be achieved by replacing the grating 48 with a spike filter at the Stokes wavelength.

Figure 3:
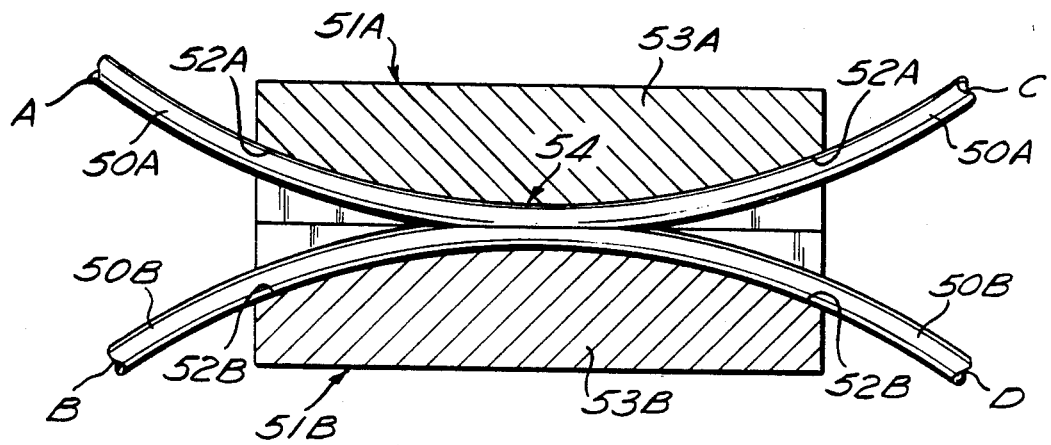
FIG. 3 is a sectional view of one embodiment of a fiber optic directional coupler for use in the optical memory of FIG. 1.

A preferred fiber optic directional coupler for use as the coupler 20 (FIG. 1) in the optical memory of the present invention is shown in FIG. 3. As illustrated therein, this coupler includes two exemplary strands 50A and 50B of a single mode fiber optic material mounted in longitudinal arcuate grooves 52A and 52B, respectively, formed in optically flat, confronting surfaces of rectangular bases or blocks 53A and 53B, respectively. The block 53A with the strand 50A mounted in the groove 52 will be referred to as the coupler half 51A, and the block 53B with the strand 50B mounted in the groove 52B will be referred to as the coupler half 51B.

The arcuate grooves 52A and 52B have a radius of curvature which is large compared to the diameter of the fibers 50, and have a width slightly larger than the fiber diameter to permit the fibers 50, when mounted therein, to conform to a path defined by the bottom walls of the grooves 52. The depth of the grooves 52A and 52B varies from a minimum at the center of the blocks 53A and 53B, respectively, to a maximum at the edges of the blocks 53A and 53B, respectively. This advantageously permits the fiber optic strands 50A and 50B, when mounted in the grooves 52A and 52B, respectively, to gradually converge toward the center and diverge toward the edges of the blocks 53A, 53B, thereby eliminating any sharp bends or abrupt changes in direction of the fibers 50 which may cause power loss through mode perturbation. In the embodiment shown, the grooves 52 are rectangular in cross-section, however, it will be understood that other suitable cross-sectional contours which will accommodate the fibers 50 may be used alternatively, such as U-shaped cross-section or a V-shaped cross-section.

At the centers of the blocks 53, in the embodiment shown, the depth of the grooves 52 which mount the strands 50 is less than the diameter of the strands 50, while at the edges of the blocks 53, the depth of the grooves 52 is preferably at least as great as the diameter of the strands 50. Fiber optic material was removed from each of the strands 50A and 50B, e.g., by lapping, to form respective oval-shaped planar surfaces, which are coplanar with the confronting surfaces of the blocks 53A, 53B. These oval surfaces, where the fiber optic material is removed, will be referred to herein as the fiber "facing surfaces". Thus, the amount of fiber optic material that has been removed increases gradually from zero towards the edges of the blocks 53 to a maximum towards the center of the blocks 53. This tapered removal of the fiber optic material enables the fibers to converge and diverge gradually, which is advantageous for avoiding backward reflection and excess loss of light energy.

In the embodiment shown, the coupler halves 51A and 51B are identical, and are assembled by placing the confronting surfaces of the blocks 53A and 53B together, so that the facing surfaces of the strands 50A and 50B are juxtaposed in facing relationship.

An index matching substance (not shown), such as index matching oil, is provided between the confronting surfaces of the blocks 53. This substance has a refractive index approximately equal to the refractive index of the fiber cladding, and also functions to prevent the optically flat surfaces from becoming permanently locked together. The oil is introduced between the blocks 53 by capillary action.

An interaction region 54 is formed at the junction of the strands 50, in which light is transferred between the strands by evanescent field coupling. It has been found that, to ensure proper evanescent field coupling, the amount of material removed from the fibers 50 must be carefully controlled so that the spacing between the core portions of the strands 50 is within a predetermined "critical zone". The evanescent fields extend into the cladding and decrease rapidly with distance outside their respective cores. Thus, sufficient material should be removed to permit each core to be positioned substantially within the envanescent field of the other. If too little material is removed, the cores will not be sufficiently close to permit the evanescent fields to cause the desired interaction of the guided modes, and thus, insufficient coupling will result. Conversely, if too much material is removed, the propagation characteristics of the fibers will be altered, resulting in loss of light energy due to mode perturbation. However, when the spacing between the cores of the strands 50 is within the critical zone, each strand receives a significant portion of the evanescent field energy from the other strand, and good coupling is achieved without significant energy loss. The critical zone includes that area in which the evanescent fields of the fibers 50A and 50B overlap with sufficient strength to provide coupling, i.e., each core is within the evanescent field of the other. However, as previously indicated, mode perturbation occurs when the cores are brought too close together. For example, it is believed that, for weakly guided modes, such as the $HE_{11}$ mode in single mode fibers, such mode perturbation begins to occur when sufficient material is removed from the fibers 50 to expose their cores. Thus, the critical zone is defined as that area in which the evanescent fields overlap with sufficient strength to cause coupling without substantial mode perturbation induced power loss.

The extent of the critical zone for a particular coupler is dependent upon a number of interrelated factors such as the parameters of the fiber itself and the geometry of the coupler. Further, for a single mode fiber having a step-index profile, the critical zone can be quite narrow. In a single mode fiber coupler of the type shown, the required center-to-center spacing between the strands 50 at the center of the coupler is typically less than a few (e.g., 2-3) core diameters.

Preferably, the strands 50A and 50B (1) are identical to each other; (2) have the same radius of curvature at the interaction region 54; and (3) have an equal amount of fiber optic material removed therefrom to form their respective facing surfaces. Thus, the fibers 50 are symmetrical, through the interaction region 54, in the plane of their facing surfaces, so that their facing surfaces are coextensive if superimposed. This ensures that the two fibers 50A and 50B will have the same propagation characteristics at the interaction region 54, and thereby avoids coupling attenuation associated with dissimilar propagation characteristics.

The blocks or bases 53 may be fabricated of any suitable rigid material. In one presently preferred embodiment, the bases 53 comprise generally rectangular blocks of fused quartz glass approximately 1 inch long, 1 inch wide, and 0.4 inch thick. In this embodiment, the fiber optic strands 50 are secured in the slots 52 by suitable cement, such as epoxy glue. One advantage of the fused quartz blocks 53 is that they have a coefficient of the thermal expansion similar to that of glass fibers, and this advantage is particularly important if the blocks 53 and fibers 50 are subjected to any heat treatment during the manufacturing process. Another suitable material for the block 53 is silicon, which also has excellent thermal properties for this application.

The coupler of FIG. 3 includes four ports, labeled A, B, C, and D, which correspond to the ports 1, 2, 3, and 4, respectively, of the coupler 20 in FIG 1. When viewed from the perspective of FIG. 3, ports A and B which correspond to strands 50A and 50B, respectively, are on the left-hand side of the coupler, while the ports C and D, which correspond to the strands 50A and 50B, respectively are on the right-hand side of the coupler. For the purposes of discussion, it will be assumed that input light is applied to port A. This light passes through the coupler and is output at port C and/or port D, depending upon the amount of power that is coupled between the strands 50. In this regard, the term "coupling ratio" is defined as the ratio of the coupled power to the total output power. In the above example, the coupling ratio would be equal to the ratio to the power at port D of the sum of the power output at ports C and D. This ratio is also referred to as the "coupling efficiency", and when so used, is typically expressed as a percent. Thus, when the term "coupling ratio" is used herein, it should be understood that the corresponding coupling efficiency is equal to the coupling ratio times 100. For example, a coupling ratio of 0.5 is equivalent to a coupling efficiency of 50%. The coupler may be "tuned" to adjust the coupling ratio to any desired value between zero and 1.0, by offsetting the facing surfaces of the blocks 53. Such tuning may be accomplished by sliding the blocks 53 laterally relative to each other, so as to increase the distance between the fiber cores.

The coupler is highly directional, with substantially all of the power applied at one side of the coupler being delivered to the other side of the coupler. That is, substantially all of the light applied to input port A is delivered to the ports C and D, without contra-directional coupling to port B. Likewise, substantially all of the light applied to port B is delivered to the ports C and D. Further, this directivity is symmetrical, so that substantially all of the light applied to either port C or input port D is delivered to the ports A and B. Moreover, the coupler is essentially non-discriminatory with respect to polarizations, and thus, preserves the polarization of the light. Thus, for example, if a light beam having a vertical polarization is input to port A, the light cross-coupled from port A to port D, as well as the light passing straight through from port A to port C, will remain vertically polarized.

The coupler is also a low loss device, having insertion or throughput losses typically on the order of 2-3 percent. The term "insertion loss", as used herein, refers to the real scattering losses of light passing through the coupler, from one side to the other. For example, if light is applied to port A, and 97% of that light reaches ports C and D (combined), the insertion loss would be 0.03 (3%). The term "coupler transmission" is defined as one minus the insertion loss. Thus, if the insertion loss is 0.03 (3%), the coupler transmission is 0.97 (97%).

Further details regarding this coupler are disclosed in U.S. Pat. No. 4,536,058 issued on Aug. 20, 1985, and U.S. Pat. No. 4,493,528, issued on Jan. 15, 1985. In addition, the coupler is described in the Mar. 29, 1980 issue of Electronics Letters, Vol. 16, No. 7, pages 260-261. These patents and the publication are hereby incorporated by reference herein.

In general, the coupler depicted in FIG. 3 exhibits wavelength dependencies such that its coupling ratio may be different for two signals having a large wavelength separation. However, for the small wavelength separation between the pump signal 33 (FIG. 1) and the signal pulse 21, the coupling ratios for the coupler of FIG. 3 are ordinarily close to each other (i.e., within 0.2).

The coupler of FIG. 3 may, nevertheless, be specially adapted to operate as a "multiplexing coupler", such that the coupler exhibits significantly different coupling ratios for different wavelengths, even if the wavelength separation is quite small. By properly selecting the radius of curvature of the fibers and the core spacing therebetween the coupler can be made to provide virtually any desired coupling ratio for substantially any pair of wavelengths.

To further explain this aspect of the invention, it will be recalled that the coupler 20 operates on evanescent field coupling principles in which guided modes of the strands 50 interact through their evanescent fields to cause light to be transferred between the strands 50 at the interaction region 54. The amount of light transferred is dependent upon the proximity and orientation of the cores as well as the effective length of the interaction region 54. The length of the interaction region 54 is dependent upon the radius of curvature of the fibers 50, and, to a limited extent, the core spacing, although it has been found that the effective length of the interaction region is substantially independent of core spacing. However, the "coupling length" (i.e., the length within the interaction region 54 which is required for a single, complete transfer of a light signal from one fiber to the other) is a function of core spacing, as well as wavelength.

If the length of the interaction region 54 is increased, and/or core spacing decreased, so that the coupling length is shorter than the effective interaction length, a phenomenon referred to herein as "overcoupling" will occur. Under these circumstances, the light will transfer back to the strand from which it originated. As the interaction length is further increased, and/or the core spacing further decreased, the effective interaction length becomes a greater multiple of the coupling length, and the light transfers back to the other strand.

Thus, the light may make multiple transfers back and forth between the two strands as it travels through the region 54, the number of such transfers being dependent on the length of the interaction region 54, the light wavelength, and the core spacing.

This phenomena permits selection of virtually any two coupling ratios for any two signals of different wavelengths. For example, by properly choosing the geometrical parameters for the coupler 20, one signal wavelength may be substantially totally coupled, while a second signal wavelength remains substantially uncoupled.

Figure 4:
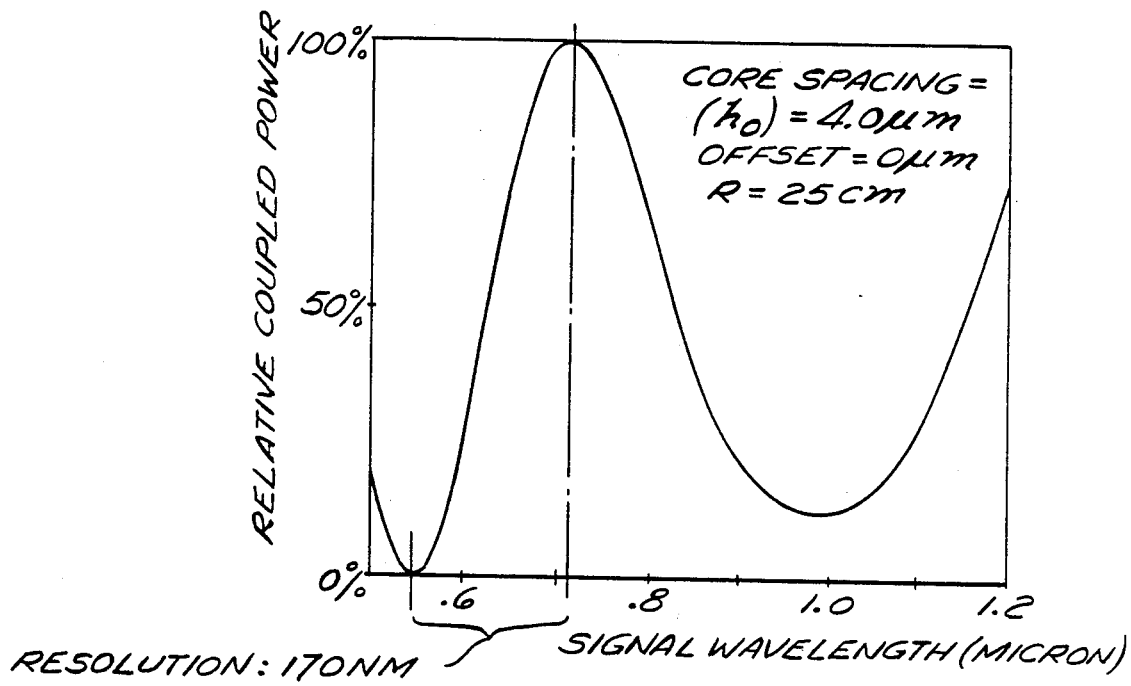
FIG. 4 is a graph showing relative coupled power versus signal wavelength for a fiber optic coupler having a minimum fiber spacing of four microns, an offset of the oval facing surfaces of zero microns, and a fiber radius of curvature of 25 centimeters.

To illustrate this wavelength dependence, FIG. 4 provides a plot of coupled power versus signal wavelength in the visible and near infrared spectrum for a particular coupler geometry. For this coupler configuration, the effective interaction length of the coupler is an odd multiple of the coupling length for the wavelength 720 nm, but an even multiple of the coupling length for the wavelength 550 nm. Thus, the wavelength 720 nm will be 100% coupled, while the wavelength 550 nm will be effectively uncoupled, yielding a wavelength resolution of 170 nm. Other wavelengths exhibit different coupling efficiencies. For example, 590 nm has a coupling efficiency of about 5–10% and 650 nm has a coupling efficiency of about 80–85%.

Figure 5:
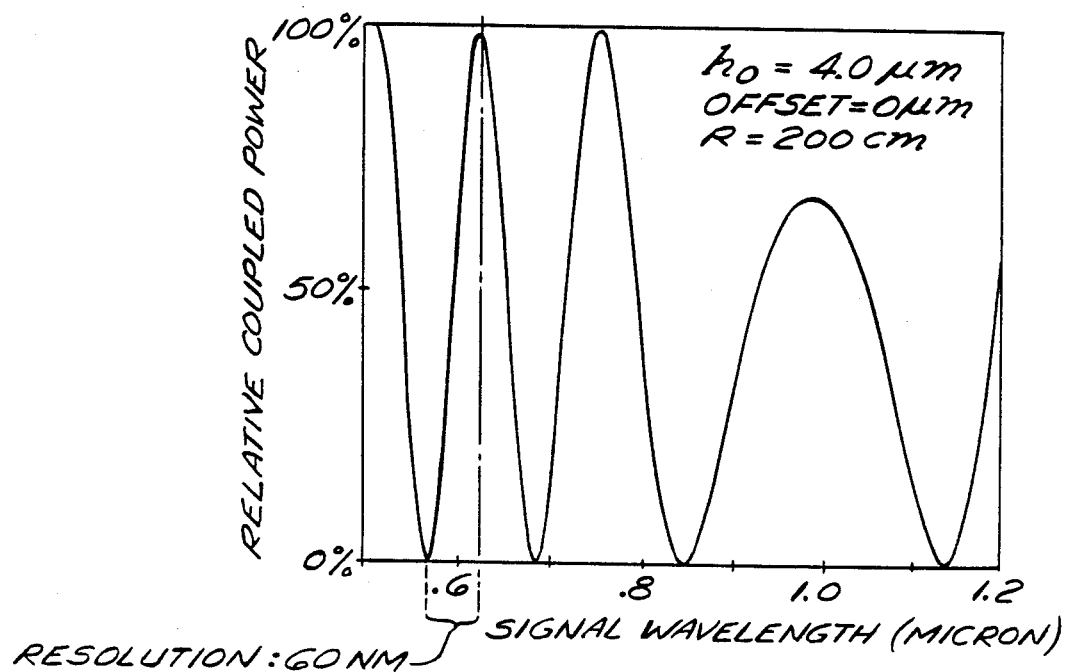
FIG. 5 is a graph of relative coupled power versus signal wavelength similar to that of FIG. 4, but for a fiber radius of 200 centimeters.

As the number of coupling lengths within the effective interaction length increases, the resolution of the multiplexing coupler is enhanced. Thus, by increasing the radius of curvature to increase the effective interaction length so that it becomes a higher multiple of the coupling length, resolution is improved. This result is illustrated in FIG. 5, which is comparable to the graph of FIG. 4, except that the radius of curvature has been increased from 25 cm to 200 cm. As expected, this increase in radius improves the coupler resolution near 600 nm from approximately 170 nm in the 25 cm radius case of FIG. 4 to approximately 60 nm in the 200 cm case.

After the resolution of the coupler has been set in accordance with the particular wavelengths of interest, the coupler may be tuned to precisely adjust the coupling length for the wavelengths to yield the desired coupling efficiencies. This is accomplished by offsetting the fibers by sliding the blocks 53A, 53B (FIG. 3) relative to each other in a direction normal to the axis of the fibers 50A, 50B. Such as offset has the effect of increasing the core spacing. If the required offset is small, it will not upset the resolution.

Figure 6:
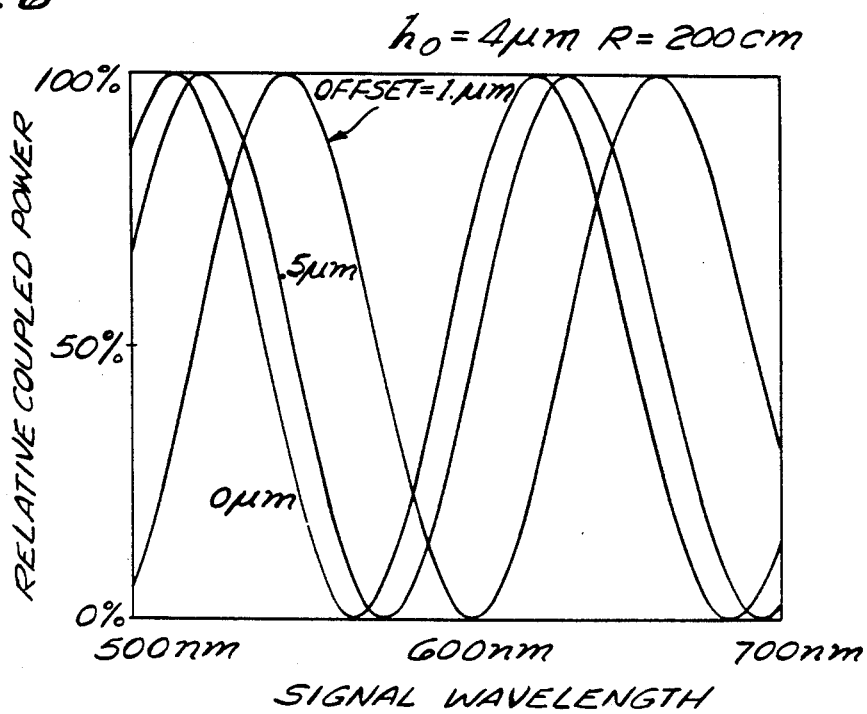
FIG. 6 is a graph of relative coupled power versus signal wavelength for a fiber optic coupler having a minimum fiber spacing of four microns, a fiber radius curvature of 200 centimeters, and a selectable fiber offset.

To illustrate the tunability of multiplexing couplers, FIG. 6 provides a plot of relative coupled power versus wavelength for three increasing values of fiber offset (0 microns, 0.5 microns, and 1.0 microns). The cure is seen to shift toward increasing wavelengths as the offset increases, while the period of oscillation (or resolution) remains virtually unchanged. In this particular example in which the radius of curvature was 200 cm and the minimum core-to-core spacing was 4 microns, a one micron offset shifted the curve by approximately 45 nm.

Additional details of the above-described multiplexing coupler may be found in U.S. Pat. No. 4,556,279 issued on Dec. 3, 1985. The wavelength dependencies of the above-described coupler are further discussed in an article by Digonnet, et al., entitled "Analysis of a Tunable Single Mode Optical Fiber Coupler", *IEEE Journal of Quantum Mechanics*, Vol. QE-18, No. 4 (April, 1982). U.S. Pat. No. 4,556,279 and the Dignnet article are incorporated herein by reference.

The embodiment of FIG. 1 of the present invention can utilize the above-described multiplexing coupler and can also utilize a standard nonmultiplexing coupler. If a multiplexing coupler is utilized, the coupler is preferably adapted to exhibit overcoupling for either the pump wavelength (e.g., 1.064 microns) or the signal pulse wavelength (e.g., 1.12 microns), so as to provide a very low coupling ratio for the pump signal 33 and a very high coupling ratio for the signal pulse 21. Except for the type of coupler used, both embodiments of FIG. 1 are the same.

Figure 7:
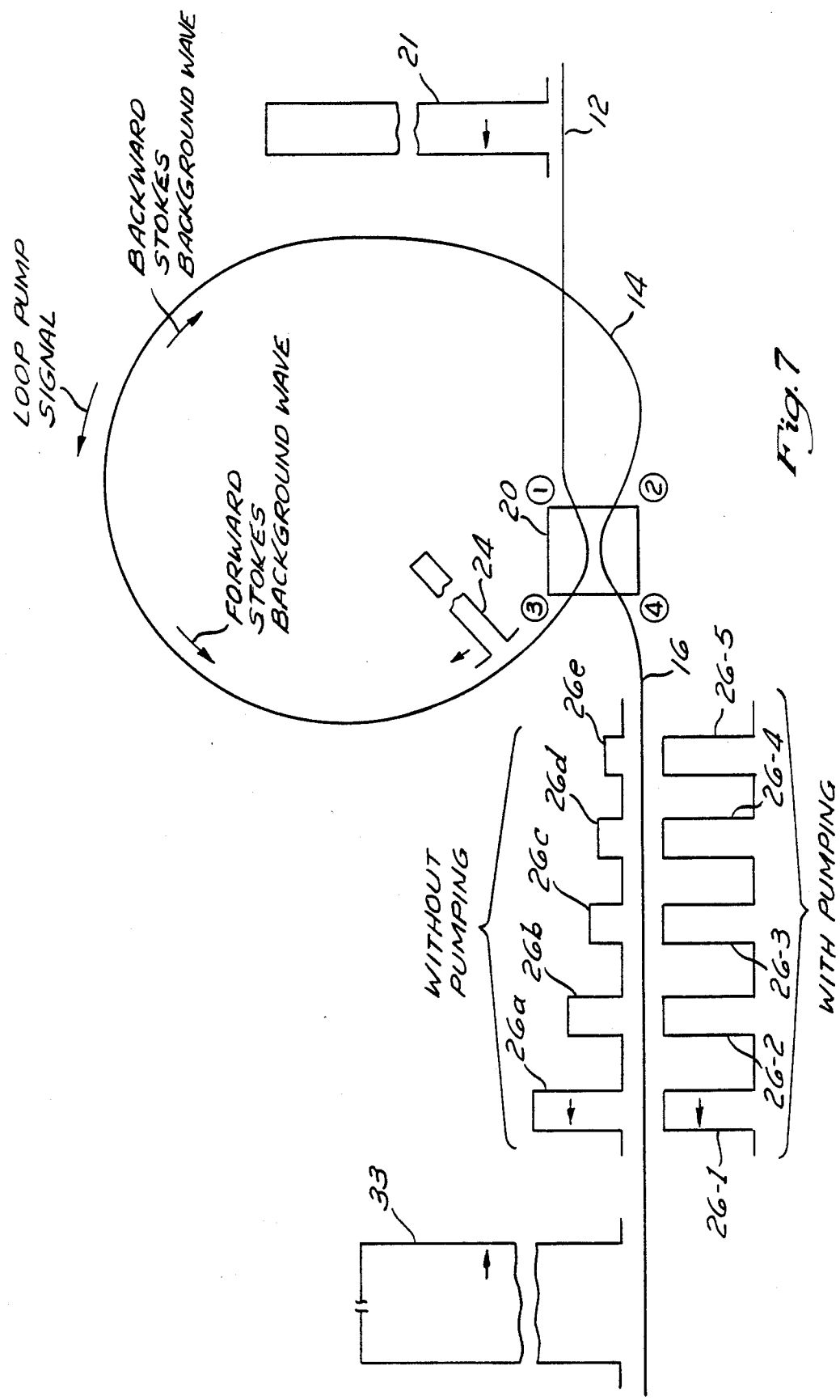
FIG. 7 is a schematic drawing showing the loop and fiber optic coupler of FIG. 1 which illustrates the operation of the invention.

The above embodiments of FIG. 1 will be discussed further in reference to FIG. 7, which shows the fiber 10 and coupler 20 of FIG. 1 without the associated components, for clarity of illustration. The device of FIG. 7 will first be described in terms of operation without the pump source 34 (FIG. 1).

In the absence of the pump 34, the input signal pulse 21 propagates along the input fiber portion 12 to port 1 of the coupler, where this pulse is split by the coupler into the circulating pulse 24, which exits the coupler through port 3, and a pulse (not shown) which exits the coupler 20 through port 4. Depending on the coupling ratio of the coupler 20, the portion of the pulse 24 exiting port 4 can be substantial. Accordingly, it would be preferable to utilize a switchable coupler as the coupler 20, if available, so that the signal pulse coupling ratio can be switched to a lower value when the signal pulse 21 is initially coupled to the loop 14, and switched back to a high value before the circulating signal 24 completes its first circulation. It should be recognized, however, that the device will function in the intended manner regardless of whether the coupler 20 is switchable.

After the pulse 24 exits port 3 of the coupler, it circulates through the loop 14 and arrives at port 2 of the coupler, where a portion of the pulse 24 is coupled to port 3, to again circulate in the loop 14, while another portion is output from port 4 as the pulse 26a. For purposes of explanation, it will be assumed that the coupling ratio of the coupler 20 for the circulating signal 24 is 0.9, and for simplicity, it will be assumed that the loop 14 and coupler 20 are lossless. If it is further assumed that the pulse 24 has a normalized value of 1.0 on its first circulation about the loop 14, it follows that 10% of the pulse 24 will exit port 4 of the coupler, yielding a normalized value of 0.1 for the first output pulse 26a. The remaining 90% of the light will be coupled to port 3 for propagation about the loop a second time, thus yielding a normalized value of 0.9 for the pulse 24 on its second circulation. When the pulse arrives back at port 2 of the coupler, 10% of the light will again exit port 4 of the coupler to form the second pulse 26b, which is delayed from the pulse 26a by an amount equal to the round-trip transit time of the fiber loop 14. The amplitude of the pulse 26b will be 10% of the 0.9 normalized value of the second recirculating pulse, or 0.09. On the third circulation, the pulse 24 will have a normalized value of 0.81 (90%×0.9). After completing the third circulation, 10% of the 0.81 normalized amplitude of the pulse 24 will be coupled to form a third output pulse 26c, which is separated from the second output pulse 26b by the round-trip transit time of the loop, and has a normalized value of 0.081. By continuing these calculations the normalized amplitude values of subsequent pulses may be found. For example, the fourth pulse 26d will have a normalized amplitude of 0.073, while the fifth pulse 26e will have a normalized amplitude of 0.066. Accordingly, it can be seen that each time the pulse 24 circulates in the loop 14, an output pulse is generated such that a train of output pulses 26 is provided at the fiber output end portion 16. Of particular significance is the fact that the output pulses 26 gradually decrease in amplitude, thereby limiting the lifetime of the optical memory (i.e., the number of useable output pulses 26). Additional details as to the lifetime of the decaying pulse train 26 may be found in U.S. Pat. No. 4,473,270, issued Sept. 25, 1984 to Shaw, which is hereby incorporated herein by reference.

The present invention advantageously amplifies the pulse 24 on each circulation through the loop 14 to compensate for round-trip losses such that the pulse 24 has a normalized value of 1.0 each time it arrives back at port 2 of the coupler, thereby providing an output pulse train 26-1 to 26-5 having a constant amplitude. This is accomplished without splicing any discrete amplifying components into the loop 14, but rather by utilizing the core of the fiber 14 as the active amplifying medium.

As was discussed in reference to FIG. 1, the pump source 34 (FIG. 1) inputs the pump signal 33 into the output end portion 16 of the fiber 10 for introduction into the loop 14 through the coupler 20. The coupler 20 splits the pump signal in an amount depending on the coupling ratio such that a portion outputs the coupler through port 1 and another portion outputs the coupler through port 2 for propagation through the loop 14. For example, assuming the coupling ratio for the pump signal 33 is the same as that previously assumed for the signal pulse 21, namely 0.9, it follows that 90% of the light will exit port 1 and be lost, while the remaining 10% will be available to propagate through the fiber loop and pump the fiber loop 14. The portion of the pump signal which propagates in the fiber loop 14 is depicted in FIG. 7 as the arrow labelled "loop pump signal". In the embodiment shown, the loop pump signal propagates in a direction opposite that of the circulating pulse 24. The pump signal duration for this embodiment is at least equal to the number (N) of desired constant amplitude output pulses (e.g., 26-1 through 26-N) times the round-trip transit time of the loop. In other words, the input pump signal pulse 33 has a sufficiently long duration such that it can be considered as a continuous wave for the desired number of circulations of the circulating pulse 24. The loop 14 is thus continuously activated by pump light throughout the duration of the constant amplitude pulse train output 26-1, 26-2 . . . 26-N. The optical power of the pump signal 33 is selected to provide sufficient optical power for the portion of this signal 33 propagating in the fiber loop 14 to cause stimulated scattering. As discussed above, such stimulated scattering will generate photons at the Stokes wavelength, so as to amplify the circulating signal pulse 24 as it propagates through the loop 14.

Although various types of stimulated scattering processes are available for use in the present invention, the preferred embodiments utilize stimulated Raman scattering. As is well known in the art, stimulated Raman scattering is a phenomena in which coherent radiation is generated by optically pumping the molecules of a material, such as an optical fiber, into an excited vibrational state. The process may be viewed as a three-level laser emission process in which molecules of the active media are exited from the ground level to an excited virtual level by absorbing input pump photons. Return of the excited molecules to an intermediate level results in the emission of photons, commonly referred to as "Stokes photons" which have a characteristic wavelength, commonly referred to as the "Stokes wavelength". In the case of SRS, the Stokes photons have a particular optical frequency relationship to the pump light which depends upon the molecular structure of the core of the optical fiber. For a preferred embodiment, which utilizes silica glass fibers, this frequency relationship causes the Stokes photons to be shifted in frequency relative to the pump signal by an amount, referred herein as the "Stokes shift", which, for SRS, is typically about 13 to 15 THz. The Stokes shift in SRS is due to the difference in energy between the incident pump photon and the vibrational level of the molecule. It should be noted that the transition of the excited molecules from the intermediate level back to the ground level results in emission of phonons, although such phonons are of little interest in the present invention, as they are quickly absorbed by the fiber and converted to heat.

As discussed above, the input signal light 21, 24 has a wavelength which is equal to the Stokes wavelength. When the circulating signal pulse 24 is injected into the loop 14, such pulse 24 will stimulate relaxation of the excited molecules and emission of photons at the Stokes wavelength. The stimulated photons have the same phase characteristics and frequency as the pulse 24, and thus, amplify the circulating pulse 24.

Those skilled in the art will understand that stimulated scattering processes are quite complex, and that the above description of amplification using stimulated Raman scattering is somewhat simplified. For example, those skilled in the art will recognize that the lifetime of the excited vibrational states of the molecules is extremely short. Accordingly, a number of the excited molecules will return to the ground state spontaneously, resulting in the spontaneous emission of Stokes photons. These spontaneously emitted Stokes photons can themselves be amplified by the same process as described above for the input signal pulse, such that a secondary wave is created in the loop, referred to herein as a "Stokes background wave". Since the fiber 10 provides an optical guiding structure, two such Stokes background waves will be generated, and these two waves will counterpropagate in the optical fiber loop 14. As shown in FIG. 7, one of the Stokes background waves travels around the loop in the same direction as the pump signal (referred herein as the "forward" Stokes background wave), while the other travels in the opposite direction around the loop relative to the pump signal (referred herein as the "backward" Stokes background wave). Since the backward Stokes background wave propagates in the same direction through the loop 14 as the circulating signal 24, the output 26 of the optical memory will be comprised of a superposition of light from the amplified signal pulse 24 and light from the backward Stokes background wave. Thus, the backward Stokes background wave may be considered as background noise in the optical memory output 26. It should be noted that the forward Stokes background wave has no significant effect on the output 26, since it propagates in a direction opposite to the circulating signal 24.

If the optical gain provided by the stimulated scattering in the fiber loop 14 is sufficiently high, these Stokes background waves may grow rapidly in amplitude, due to the fact that they will be amplified in the same manner as the circulating pulse 24, thereby increasing the noise level and adversely affecting the signal to noise ratio. Fortunately, it has been found that, by properly controlling the optical gain provided by the stimulated scattering process in the loop 14, the growth of the background Stokes wave can be maintained at a level, such that the background Stokes power is several orders of magnitude below that of the circulating signal 24 for a large numbers of circulations (e.g. thousands).

The optical power of the input pump signal 33 should be selected to provide sufficient pump power in the fiber loop 14 such that the stimulated scattering process yields just enough amplification (e.g., Raman gain) to compensate for the total round-trip loop losses of the circulating pulse 24. A portion of these round-trip loop losses is due to fiber attenuation which causes propagation losses in the optical fiber loop 14. These propagation losses cause some degradation of the pulse 24 as it propagates around the loop 14. The attenuation ($\alpha$) of an optical fiber is typically expressed in dB per kilometer. Thus, the total propagation losses per circulation (in dB) due to fiber attenuation are equal to $\alpha L$, where L is length of the fiber loop 14 in kilometers. Additional losses are caused by the fact that a portion of the pulse 24 is lost from the loop 14 on each circulation due to tapping by the coupler 20 to form the output signals 26. For the configuration disclosed, such coupling losses will be a function of $1-\eta_s$, where $\eta_s$ is the coupling ratio of the coupler 20 for the signal pulse 24. The total round-trip loop losses ($\delta$) of the optical signal pulse 24 may be expressed as follows:

$$\delta = (1-\eta_s)[1-\exp(-\alpha_s L)] \quad (1)$$

Where $\alpha_s$ is the attenuation coefficient at the Stokes wavelength, expressed in km$^{-1}$ through the following conversion: $\alpha_s(\text{km}^{-1}) = \alpha_s(\text{dB/km})/(10 \log_{10} e)$.

Equation 1 thus indicates the fraction of the optical power of the pulse 24 which is lost on each circulation through the loop 14. The fraction of optical power remaining in the loop 14 will be referred to as the loop transmission ($T_{loop}$), and is given by:

$$T_{loop} = \eta_s T_s \quad (2)$$

where $T_s$ is the fiber transmission for the signal pulse 24 (i.e., $\exp(-\alpha_s L)$).

Those skilled in the art will understand that there is an additional source of loss which was not discussed above, namely, the coupler insertion losses. However, for the coupler 20, these losses are quite small (e.g., 0.15 db), and thus may be ignored. However, if a coupler having high insertion losses is used as the coupler 20, these coupler insertion losses should be taken into account, for example, by adding the insertion losses to the fiber propagation losses.

For a given input pump power $P_p$, the Raman optical gain (G) in the fiber loop 14 may be expressed as:

$$G = \exp\left[\frac{gL_f P_p}{A_f} \frac{(1-\eta_p)}{(1-T_p\eta_p)}\right] \quad (3)$$

where $\theta_p$ is the coupling ratio of the pump signal, g is the Raman gain coefficient, $A_f$ is the effective interaction area accounting for the pump signal and signal pulse 24 mode overlap in the fiber 14, and $L_f$ is the effective fiber length of interaction area (explicitly $L_f = (1-T_p)/\alpha_p$), where $T_p$ is the fiber transmission at the pump wavelength, and $\alpha_p$ is the attenuation coefficient at the pump wavelength. In order to maintain the recirculating pulse 24 at constant intensity, the gain (G) should equal the total loop loss ($\delta$), such that:

$$GT_{loop} = 1 \quad (4)$$

It may thus be found that the amount of optical power ($P_{pc}$) of the input pump signal 33 which is necessary to maintain constant intensity of the recirculating pulse 24 is given by:

$$P_{pc} = \frac{A_f}{gL_f}(\alpha_s L - \log \eta_s)\frac{1-\eta_p e^{-\alpha_p L}}{1-\eta_p} \quad (6)$$

If the signal pulse coupling ratio ($\eta_s$) and the pump signal coupling ratio ($\eta_p$) are substantially the same, Equation 5 may be rewritten as:

$$P_{pc} = \frac{A_f}{gL_f}(\alpha_s L - \log \eta)\frac{1-\eta e^{-\alpha_p L}}{1-\eta} \quad (6)$$

where $\eta$ is the coupling ratio of both the pump signal and the signal pulse (i.e. $\eta_s = \eta_p = \eta$).

Figure 8:
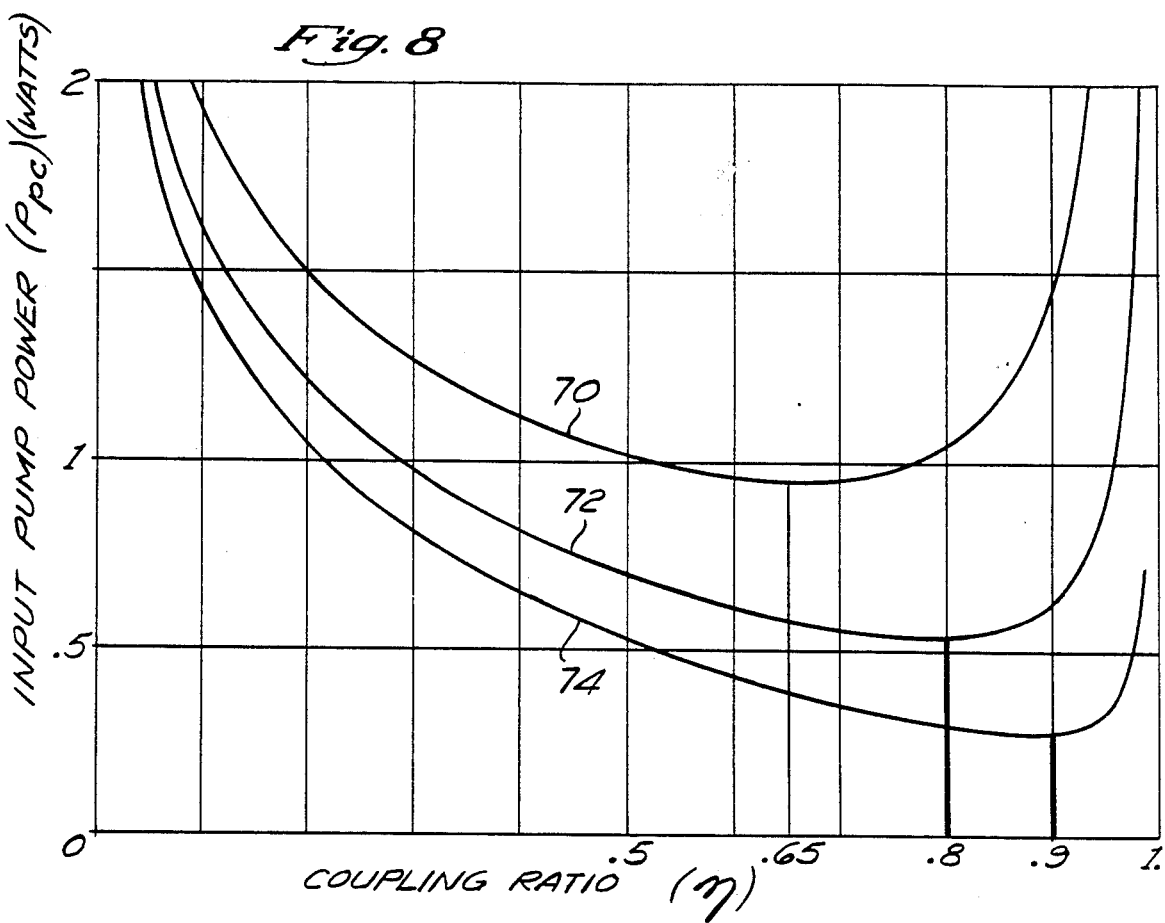
FIG. 8 is a graph of the input pump power required to cause insufficient Raman gain to make the train of output pulses substantially constant in intensity as a function of the coupling ratio of a standard coupler.

Equation 6 is a transcendental equation, and thus, the coupling coefficient cannot be expressed directly as a function of the pump power ($P_{pc}$). However, for any given set of fiber parameters ($\alpha$, g, $L_f$, $A_f$), the pump power $P_{pc}$ defined by Equation (6) may be plotted as a function of the coupling ratio, as shown in the curves of FIG. 8. In developing the curves of FIG. 8, it was assumed that the fiber attenuation for the signal light ($\alpha_s$) and the fiber attenuation for the pump light ($\alpha_p$) were equal (i.e., $\alpha_s = \alpha_p = \alpha$), which is a very good approximation.

The curves of FIG. 8 illustrate the coupling ratio as a function of the input pump power, $P_{pc}$ (in watts) necessary to achieve an optical gain which will compensate for total loop losses, for various values of fiber attenuation ($\alpha$) assuming, in accordance with Equation 6, that the coupler 20 exhibits substantially the same coupling ratios for the pump light and the signal light. It was also assumed that the loop length (L) was 810 meters. As shown in FIG. 8, the optical input pump power ($P_{pc}$) required for loop loss compensation varies dramatically with the coupling ratio ($\eta$). Indeed, the required pump power ($P_{pc}$) increases toward infinite values for very low coupling ratios and for very high coupling ratios. For intermediate coupling ratios, the required pump power $P_{pc}$ decreases dramatically. Further, there is an optimum coupling ratio for each value of fiber attenuation $\alpha$. In this exemplary set of curves, the curve 70 corresponds to a fiber attenuation of 1.8 dB per kilometer, while the curve 72 and 74 correspond to attenuations of 1.0 dB per kilometer and 0.5 dB per kilometer, respectively. It may be seen that, in general, the required pump power $P_{pc}$ decreases as the fiber attenuation decreases. Further, there is an optimum coupling ratio for each of the curves 70, 72, 74, corresponding to the point of zero slope, at which the required pump power $P_{pc}$ is a minimum. Significantly, as the fiber attenuation decreases, these optimum coupling ratios increase, whereas the required pump power $P_{pc}$ decreases. Thus, by properly selecting the coupling ratio for the particular fiber utilized, the required pump power $P_{pc}$ can be reduced and minimized.

In the present invention, it is preferable that the pump power utilized be no more than about 2 watts. It has been found, for example, that pump powers in excess of 2 watts tend to cause "burn out" of the coupler 20, in that the index matching oil between the blocks 53 tends to burn, thereby damaging the coupler. Although such coupler "burn out" might be alleviated by fusing the fiber together without oil therebetween, high optical powers are disadvantageous for other reasons. For example, they may cause undesirable non-linear effects (e.g., multi-Stokes effect) in the fiber 10. Further, high power laser instability may cause enhanced amplitude variations in the output pulse train 26, as opposed to lower power lasers. Moreover, such amplitude instability of high power lasers tend to cause the circulating Stokes background waves to build up very rapidly in the fiber loop. This buildup of the Stokes background can significantly reduce the signal to noise ratio of the output pulses and/or cause coupler burn out.

Accordingly, the coupling ratio of the coupler 20 should be selected such that the input pump signal 33 optical power $P_{pc}$ required for loop loss compensation is no greater than about 2 watts. This relationship may be defined by rewriting Equation 6 as:

$$2 \geq \frac{A_f}{gL_f}(\alpha_s L - \log \eta)\frac{1 - \eta e^{-\alpha_p L}}{1 - \eta} \qquad (7)$$

It will be recognized that Equations 6 and 7 assume that the coupling ratios for the pump light and the signal light are the same. Thus, these equations are accurate to a good approximation only in the event that a "standard" coupler is utilized.

If the signal pulse coupling ratio and the pump signal coupling ratio are not close to each other, e.g., as in the case of a multiplexing coupler, Equations 6 and 7 may not be sufficiently accurate. In such event, the pump power $P_{pc}$ required for constant amplitude output pulses 26 should be determined in accordance with Equation 5, above, which may be rewritten to express the signal coupling ratio ($\eta_s$) as a function of the pump coupling ratio ($\eta_p$), with the pump power $P_{pc}$ as a parameter, as follows:

$$\eta_s = \exp\left[\alpha_s L - \frac{gL_f P_{pc}(1 - \eta_p)}{A_f(1 - \eta_p e^{-\alpha_p L})}\right] \qquad (8)$$

Figure 9A:
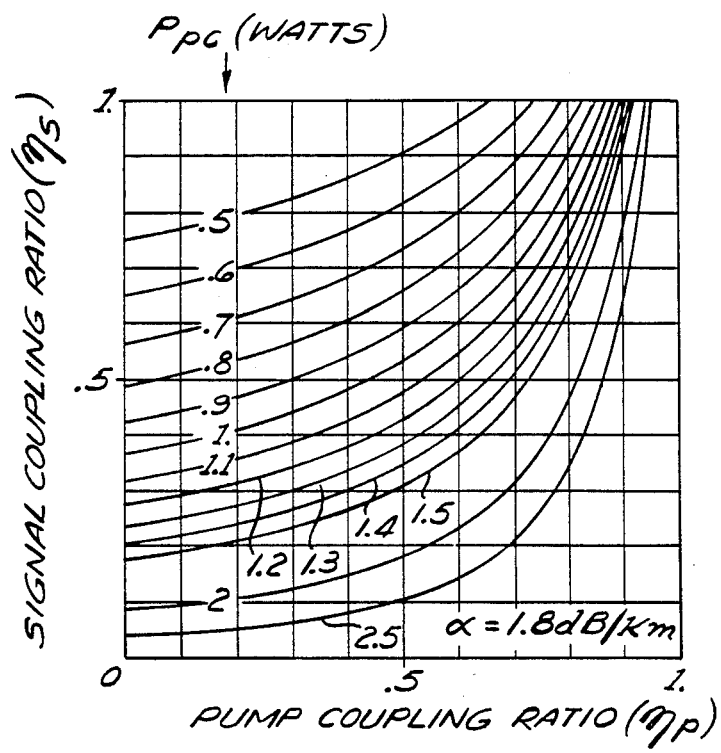
FIGS. 9a and 9b are graphs of the signal coupling ratio as a function of the pump coupling ratio for a multiplexing coupler, with the input pump power required for constant amplitude output pulses as a parameter, for two different values of fiber attenuation.
Figure 9B:
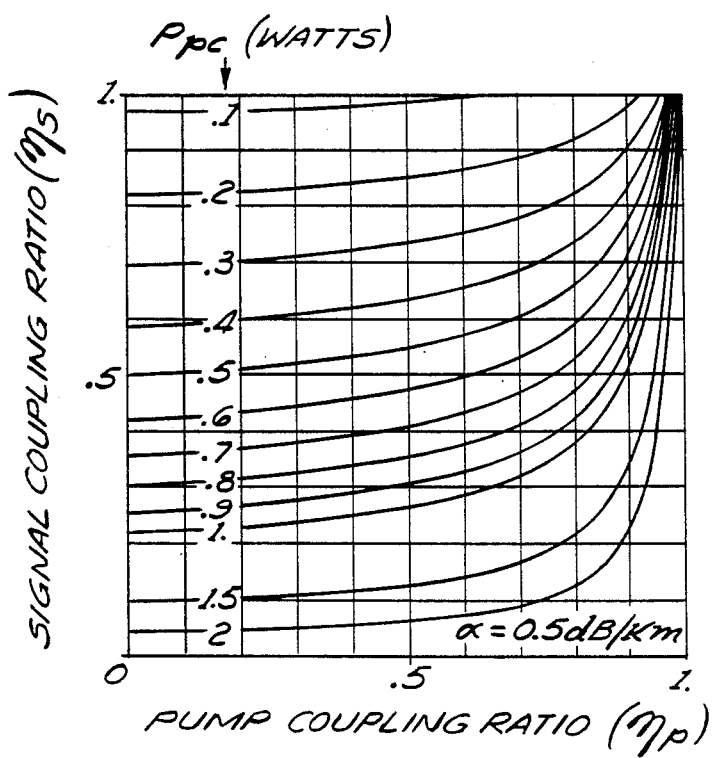

Equation 8 defines a family of curves, as shown in FIGS. 9a and 9b. FIG. 9a illustrates the signal coupling ratio ($\eta_s$) at the signal wavelength of 1.12 microns as a function of the pump coupling ratio ($\eta_p$) at the pump wavelength of 1.064 microns for various values of $P_{pc}$, with a fiber attenuation of 1.8 dB per kilometer. FIG. 9b shows the same relationships as FIG. 9a, but for a fiber attenuation of 0.5 dB per kilometer. As in FIG. 8, it was assumed in FIGS. 9a and 9b that $\alpha_s = \alpha_p = \alpha$, which is a very good approximation. It may be seen from the curves of FIGS. 9a and 9b that the pump power $P_{pc}$ is, in general, at a minimum when the signal coupling ratio is close to one and the pump coupling ratio is equal to zero. Indeed, for any given signal coupling ratio, the pump power $P_p$ for that coupling ratio is at a minimum when the pump coupling ratio is equal to zero. Conversely, for any given pump coupling ratio, the pump power $P_{pc}$ decreased as the signal coupling ratio increases.

It will be understood that a high signal coupling ratio advantageously decreases the round-trip loop losses, since less optical power is coupled from the loop to form the constant amplitude output pulses 26. Although it is advantageous to select the signal coupling ratio so that it is close to unity, it should preferably not be exactly unity, otherwise there will be no light coupled from the loop to form the output pulse train 26. On the other hand, the pump signal ratio should preferably be zero, or close to zero, so as to couple maximum pump power to the loop, and thereby efficiently use such pump power to cause Raman gain in the loop.

From the foregoing, it will be understood that, although the invention may be implemented utilizing either a standard coupler or a multiplexing coupler, a multiplexing coupler is advantageous in that it provides the gain necessary to achieve constant amplitude output pulses 26 at a lower optical power of the input pump signal 33. In the case of a multiplexing coupler, the signal coupling ratio and pump coupling ratio may be selected independently of each other so as to achieve low loop loss while still coupling substantially all of the pump light signal to the loop for maximum pumping efficiency. In the case of a standard coupler, the pump and signal coupling ratios are close to each other, and thus, a compromise must be drawn between the loop losses and the amount of pump power coupled to the loop. As discussed in reference to FIG. 8, there is a particular coupling ratio compromise which makes it possible to minimize the pump power $P_{pc}$.

Regardless of whether a standard coupler or a multiplexing coupler is used, the coupling ratios should preferably be selected so that the pump signal 33 optical power $P_{pc}$ is no greater than 2 watts, for the reasons discussed above. From Equation 8, it may be found that this result is achieved when the signal coupling ratio is related to the pump coupling ratio as follows:

$$\eta_s \geq \exp\left[\alpha_s L - \frac{2qL_f(1 - \eta_p)}{A_f(1 - \eta_p e^{-\alpha_p L})}\right] \qquad (9)$$

Although the pump power required for constant amplitude output pulses 26 may be readily calculated from the foregoing equations, it may be advantageous to adjust the pump power $P_{pc}$ downwards very slightly to suppress any build-up of the Stokes background waves. As discussed previously, these Stokes background waves are amplified with the signal pulse, and their growth can significantly reduce the signal to noise ratio. It is believed that growth of the Stokes background waves is related to the stability of the pump laser, such that the greater the pump signal fluctuations, the higher the rate of growth of the Stokes background waves. For pump lasers having amplitude fluctuations of no more than about 10% from a nominal value, the amount of downward adjustment of the pump power necessary to suppress build-up of the Stokes background waves is typically very small, such that the output pulses 26 are still substantially constant in amplitude over a large number of circulations. It is expected that use of highly stable pump sources at appropriate wavelengths will substantially reduce any problems relating to build-up of the Stokes background waves, and will permit the memory of the present invention to achieve millions of circulations without significant degradation of the recirculating signal pulses and build-up of background noise. Further, due to the low pump power requirements of the present invention, it is expected that the invention may be implemented using high power laser diodes. Such laser diodes are advantageous in that, through proper control of the driving current, the amplitude of the laser output can be made highly stable. In addition, laser diodes have the advantage of permitting the invention to be compactly packaged in a relatively small unit.

Although preferred embodiments of the invention utilize stimulated Raman scattering, it will be recognized that other types of scattering processes may be used alternatively. For example, those skilled in the art will understand that the invention may be implemented utilizing stimulated Brillouin scattering, or four photon mixing. Stimulated Raman scattering is preferred because (1) it does not have any phase matching requirements, (2) it can be implemented in both forward and backward configurations, and (3) the Raman gain curve is relatively large so that frequency matching between the signal pulse and the pump generated Stokes light does not have to be as precise, thereby making it possible to use a signal pulse having a larger bandwidth. Additional advantages of Raman scattering will be apparent to those skilled in the art.

An exemplary embodiment corresponding to the arrangement shown in FIG. 1 was tested. In the experimental set-up, the signal generating loop 44 (FIG. 2) was formed from 1 km length of non-polarization holding fiber. The pump pulses from the laser 42 (FIG. 2) had a peak power of 120 watts and a repetition rate of 50 Hz, thus generating 500 ns signal pulses 21. Each signal pulse 21 had an intensity of about 50 mW.

The loop 14 (FIGS. 1 and 7) was formed of 810 meters of 6 micron core diameter single mode non-polarization holding fiber. The coupler 20 was a standard coupler presenting coupling ratios of 0.48 and 0.66 at the pump and Stokes wavelengths, respectively.

The pump laser 34 was a 2 watt cw Nd:YAG laser. The output of this laser was chopped in 0.5 ms pulses synchronized to the output of the Q-switches YAG laser used for pulsed signal generation. The intensity of the input pump signal 33 was about 708 mW.

The fiber attenuation was 2.26 dB per km, the interaction area was 38.3 $\mu m^2$, and the interaction length was 676 meters. The Raman gain coefficient was experimentally determined to be $8.5 \times 10^{-14}$ meters per watt.

A total of about 130 pulses of substantially constant amplitude were observed during the duration of the pump signal (0.5 ms). This corresponds to an optical path of nearly 105 km or a time delay of 500 microseconds between the first output pulse and the last output pulse. Accordingly, the embodiment of FIG. 1 of the present invention provides an optical memory having a significantly longer lifetime than prior art optical memories. Further, it is believed that this is the first optical memory utilizing in-line amplification through the non-linear properties of optical fibers.

As discussed above, it is important that the pump power in the recirculating loop be maintained at or below the critical pump power in order to minimize the build-up of Stokes noise. It has been established experimentally that pump power fluctuations about the critical level cause gain fluctuations in the recirculating loop that result in the dramatic build-up of the Stokes intensities. Although instability of the pump source is a principal cause of such gain fluctuations, it has been found that gain fluctuations in the recirculating loop can also be attributed to phase noise in the pump power in the loop caused by the interaction of the pump signals circulating in the loop with pump signals entering the loop from the pump source. This phase noise is associated with a low coherence optical signal, such as is preferred for the pump signal in the present invention, and results in a structured intensity noise in the pump power in the loop. This intensity noise is minimal at low pump signal coupling ratios, and thus, the noise can be avoided through use of a multiplexing coupler having a pump coupling ratio of zero. However, for pump coupling ratios substantially greater than zero, particularly intermediate pump signal coupling ratios, such as those used for some embodiments of the present invention, pump power fluctuations due to phase noise can result in broadband modulation of the gain in the loop which causes significant signal noise and build-up of Stokes noise.

FIG. 10 illustrates a preferred embodiment of the above-described invention which reduces the phase noise and thus reduces the build-up of Stokes noise in the loop. The phase noise reduction is accomplished by utilizing a pump signal modulation scheme in which the pump power is input in the form of pulses which have a duration and are spaced in time in relation to the loop transit time to reduce the interaction between the recirculating pump light and the pump light input to the loop.

The embodiment of FIG. 10 comprises a signal generator 100, shown in dashed lines, which corresponds generally to the signal generator 22 described above in connection with FIG. 2. The signal generator 100 advantageously comprises a Q-switched Nd:YAG laser 102 which advantageously operates at a wavelength of 1.064 microns, for example, to provide pump light; an optical fiber signal generating loop 106 that receives the pump light from the laser 102; a lens 110 through which the light generated by the laser 100 is input to the signal generating loop 106; a lens 112 through which the light from the signal generating loop 105 is output; and an interference filter 120. The signal generator 100 operates in a manner similar to that described above in connection with FIG. 2 to produce a pulse signal. The 1.064 micron pump light entering the signal generating loop 106 stimulates 1.12 micron Stokes waves which exit the loop 106 through the lens 112. In an exemplary embodiment, the Q-switched laser 102 is operated at a low repetition rate, for example 31 Hz, and with a relatively low duty cycle to generate relatively narrow pulses, for example 280 nanosecond pulses.

The interference filter 120 has a 30 nanometer bandwidth and suppresses the 1.064 micron pump signal pulses and transmits only the 1.12 micron Stokes signal generated in the signal generating loop 106. The resulting 1.12 micron signal pulses from the interference filter 120 are input through a lens 132 into a first end of a fiber 134 which forms a recirculating loop 130. The recirculating loop 130 generally corresponds to the recirculating loop 10 of FIG. 1. The fiber 134 preferably comprises a continuous, uninterrupted length of a single-mode optical fiber 134. A coupler 136 is interconnected in the manner described above in connection with FIG. 1 so that the fiber 134 forms the loop 130. Preferably, the fiber 134 is a nonpolarization-preserving single-mode fiber having a 6 micron core and a 720 nanometer cutoff wavelength. The coupler 136, which generally corresponds to the coupler 20 in FIG. 1 and FIG. 3, has four ports 1, 2, 3, and 4, and has a coupling ratio greater than zero. The signal propagates in the fiber 134 from the interference filter 120 to the coupler 136 and enters the coupler 136 via the port 1. A coupled portion of each 1.12 micron signal pulse entering the coupler 136 via the port 1 from the interference filter 120 exits the coupler via the port 4 as a first 1.12 micron signal output pulse. An uncoupled portion of the 1.12 micron signal pulse entering the coupler via the port 1 exits the coupler 136 via the port 3 and travels around the loop portion of the fiber 134 and reenters the coupler 136 via the port 2. An uncoupled portion of the 1.12 microns signal pulse entering the coupler 136 from the loop portion via the port 2 exits the coupler 136 via the port 4 as a second 1.12 micron signal output pulse, and a coupled portion of the 1.12 micron signal pulse entering the coupler 136 via the port 2 exits the coupler 136 via the port 3 and recirculates through the loop portion of the fiber 130. Thus, each 1.12 micron input signal entering the loop 130 via the port 1 of the coupler 136 will recirculate in the loop 130 as described above so that a portion of the signal is output after the completion of each transit of the loop 130 of the fiber 134. The output portions of the circulating signal comprise a series or train of 1.12 micron signal output pulses that are spaced apart in time by an amount equal to the loop transit time.

A loop pump source 140 is provided that generates a pump signal at a wavelength which causes Raman gain, which, for a fused silica fiber and a signal wavelength of 1.12 microns, is 1.064 microns. The pump signal from the loop pump source 140 is input to the loop 130 via the port 4 of the coupler 136 so that the pump signal recirculates around the loop 130 in the direction opposite the direction of recirculation of the 1.12 micron signal pulses described above (i.e., the pump signal is counter-propagating with respect to the 1.12 micron signal pulses). The pump signal causes stimulated Raman scattering in the fiber 134 of the loop 130 which amplifies the recirculating signal pulses as described above. Those skilled in the art will understand that Raman gain can be produced in fibers at a number of frequencies in which the pump frequency is separated from the signal frequency by the amount of the Raman shift (e.g., 13–14 Terahertz). The choice of frequency for the described embodiment was due in part to the ready availability of a laser pump source at 1.064 microns.

In the embodiment shown in FIG. 10, the loop pump source 140 comprises a polarized Nd:YAG continuous wave (CW) laser 150 which operates at 1.064 microns. The output of the CW laser 150 is passed through an acousto-optic modulator 152 which modulates the amplitude of the pump light. The acousto-optic modulator 152 is driven by an enable pulse generator 154 which is controlled by a gate generator 156. The gate generator 156 is controlled by an amplifier 158 which is connected to the output of a photodetector 160. The photodetector 160 receives light from a beam splitter 162 which is positioned in the optical path of the light from the Q-switched laser 102 in the generator 100 so that the photodetector 160 provides an active output signal when the Q-switched laser 102 generates the pump signal for the signal generating loop 106. The active output signal from the amplifier 158 causes the gate generator 156 to generate an active gating pulse which is thus synchronized with the signal pulses which are produced in the signal generating loop 106. The gate generator 156 generates a gating pulse having an adjustable pulse width. Thus, the gate generator 156 operates in a manner similar to a one-shot multivibrator to produce a single gating pulse which begins in synchronism with the pump signal generated by the Q-switched laser 102 and ends in accordance with the selected pulse width.

The gating pulse from the gate generator 156 controls the enable pulse generator 154. When the gating pulse is active, the enable pulse generator 154 generates a series of periodic enabling pulses having a selectable width (i.e., time duration) and a selectable repetition rate or periodicity (i.e., time duration between the beginning of a pulse and the beginning of the next successive pulse). The periodic enabling pulses from the pulse generator 154 control the acousto-optic modulator 152. When the periodic enabling pulses are active, the acousto-optic modulator 152 gates the pump signal from the CW laser 150 to the output of the opump source 140 to create a series of pump pulses which enter the loop 130 via the port 4 of the coupler 136. When the periodic enabling pulses are inactive, the acousto-optic modulator 152 blocks the pump signal from the CW laser 150 so that no pump signals are output from the pump source 140. The series of enabling pulses and thus the series of pump pulses will continue to occur so long as the gating pulse generated by the gate generator 156 is active. These pump pulses are illustrated in FIG. 11a. In the preferred embodiment of FIG. 10, the pulse widths and repetition rates of the periodic enabling pulses from the pulse generator 154 and thus the widths and repetition rates of the pump pulses gated through the acousto-optic modulator 152 are preferably selected so that the pump pulses entering the loop 130 do not overlap with the first few recirculations of pump pulses which have previously entered the loop 130 as will be discussed more fully below in connection with FIGS. 11a–11d.

In the preferred embodiment of the invention illustrated in FIG. 10, the pump source 140 is optically isolated from power backscattered by the loop 130 with a Glan polarizer 170 and a quarter-wave plate 172. A fiber polarization controller 174 is advantageously placed on the pump input end of the loop 130 and is used to adjust the backscattered light polarization and thus maximize the amount of backscattered power which is rejected by the Glan polarizer 170. Since the optical fiber 134 is preferably nonpolarization-preserving, and since the coupler coupling ratio is substantially polarization-independent, the polarization controller 174 does not substantially affect pump power input to the loop and thus does not substantially affect the signal recirculations in the loop 130. A lens 176 is also preferably included to direct the output signal from the polarization controller 174 to the quarter-wave plate 172.

The Glan polarizer 170 also acts as a beam splitter that directs a portion of the output signal from the loop 130 to a monochromator 180. The output of the monochromator 180 is directed onto a photodetector 182 which provides an electrical representation of the output signal from the loop 130. In the experimental set up, the electrical output from the photodetector 182 is provided to an oscilloscope 184 so that the signal can be analyzed. When incorporated into a system, the electrical output from the photodetector 182 can be provided to other portions of the system to provide a representation of the pulses output from the loop. Alternatively, the optical output pulses from the monochromator 180 can be provided directly to optical fiber components of a system.

As mentioned above, phase noise reduction is accomplished in the embodiment of FIG. 10 by modulating the light produced by the pump source 140 to provide a series of pump pulses having a duration and spacing selected in relation to the transit time of the fiber loop 130 to reduce the interaction between the pump light recirculating in the loop 130 and the pump light input to por5 4 of the coupler 136. A specific example of a pulsed wave form utilized to reduce phase noise, and thereby suppress build up of the Stokes waves, is illustrated in FIGS. 11a and 11b. FIG. 11a depicts an exemplary train of pump pulses referred to herein as "pump input pulses" which are produced by the source 140 and input to port 4 of the coupler 136. These pump input pulses, which are shown in FIG. 11a with respect to time, include a first pump input pulse 202, a second pump input pulse 204, a third pump input pulse 206, and fourth, fifth, sixth and seventh pump input pulses 208, 210, 212 and 214, respectively. Each pump input pulse has a width (i.e., time duration) of approximately one-fourth the loop transit time. The loop transit time is shown as $t_{delay}$. Thus, each pump pulse has a width of approximately ¼ $t_{delay}$. The pump input pulses 202-214 have a periodicity (i.e., time between the beginnings of successive pump input pulses) selected to be substantially equal to ⅜ $t_{delay}$.

When an input pump pulse reaches port 4 of the coupler, a portion is coupled to the loop 130 to form a circulating pump pulse which is delayed in time on each circulation by an amount $t_{delay}$. A circulating pump pulse which has circulated once through the loop 130 will be referred to as a "once-delayed" pump pulse. Similarly, a pulse which has circulated twice through the loop 130 will be referred to as a "twice-delayed" pump pulse, and so forth.

FIG. 11b illustrates a train of once-delayed pump pulses with respect to time and with respect to the pump input pulse train of FIG. 11a. The first pump pulse entering the loop (e.g., the first pump input pulse 202) circulates through the loop and arrives back at the coupler 136 after a delay of $t_{delay}$ as a once-delayed first pump pulse 202'. Since the delay time through the loop 130 is greater than the time between pump input pulses, the once-delayed first pump pulse 202' does not overlap with the second pump input pulse 204 and instead arrives at the coupler 136 with a delay of $t_{delay}/4$ with respect to the second pump input pulse 204. Similarly, the second pump input pulse 204 will be delayed by the time $t_{delay}$ and will arrive at the coupler 136 as a once-delayed second pump pulse 204' with a delay of $t_{delay}/4$ with respect to the third pump input pulse 206. Additional once-delayed pump pulses 204', 206', 208', 210', etc., in the train of once-delayed pump pulses will arrive at the coupler 136 with corresponding delays with respect to the pump input pulses in the train of pump input pulses. None of the pulses in the train of once-delayed pump pulses overlap with any of the pulses in the train of pump input pulses.

FIG. 11c illustrates a train of twice-delay pump pulses with respect to time and with respect to the pump pulse trains of FIGS. 11a and 11b. After an additional delay of $t_{delay}$ with respect to the once-delayed first pump pulse 202', a twice-delayed first pump pulse 202" arrives at the coupler 136. The twice-delayed first pump pulse 202" does not overlap with any of the pump input pulses (FIG. 11a) or with any of the once-delayed pump pulses (FIG. 11b). Similarly, a twice-delayed second pump pulse 204", a twice-delayed third pump pulse 206", and so forth, do not overlap with any of the pump input pulses or with any of the once-delayed pump pulses.

FIG. 11d illustrates a train of thrice-delayed pump pulses with respect to time and with respect to the pulse trains of FIGS. 11a, 11b, and 11c. After an additional delay of $t_{delay}$ with respect to the twice-delayed first pump pulse 202", a thrice-delayed first pump pulse 202'" arrives at the coupler 136. As illustrated, the thrice-delayed first pump pulse 202'" overlaps the fifth pump input pulse 210 in the pump input pulse train (FIG. 11a). Subsequent thrice-delayed pump pulses 204'", 206'", etc., overlap with the sixth, seventh, and so forth, pump input pulses. Although the thrice-delayed pump pulse train overlaps the pump input pulse train, the effect of the thrice-delayed pump pulse train is minimized because the pulses in the thrice-delayed pump pulse train of FIG. 11d are substantially attenuated by the recirculations in the loop 130. For example, in one embodiment, the pump coupling ratio $\eta_p$ and the loop attenuation for the pump signal may be such that each pulse is reduced by one-half during each recirculation (i.e., the intensity of the once-delayed first pump pulse 202' is one-half the intensity of the first pump input pulse, the intensity of the twice-delayed first pump pulse 202" is approximately one-half the intensity of the once-delayed first pump pulse 202', etc.). Thus, for this example, the thrice-delayed first pump pulse 202'" has an intensity of one-eighth the intensity of the fifth pump input pulse 210. Thus, the interaction between the pulses in the pump input pulse train and the circulating pulses in the thrice-delayed pump pulse train is substantially reduced, and the pump intensity noise caused by the interference of the recirculating pump power with the input pump power, both of which have a high phase noise, is also substantially reduced. The pump intensity noise and power fluctuations can be further reduced by increasing the number of pulses before overlapping occurs, which can be done by reducing the pulse widths of the pump pulses. For example, in an alternative embodiment (not shown), each pulse can have a pulse width of $t_{delay}/5$ and a repetition rate of 4/5 $t_{delay}$. In this alternative embodiment, there will be no overlap of a circulating pulse with a pump input pulse until the sixth pump input pulse arrives at the coupler 136. Using the above example, at the time that the first circulating pulse overlaps with the sixth pump input pulse the first circulating pulse would have traversed the loop four times, thereby reducing its intensity to approximately 1/16 of the intensity of the input pulses.

The effective pump power in the loop $p_{eff}$ is a summation of the effects of each of the recirculating pump pulses in the loop. It can be shown that for the example described above, the steady-state pump power corresponding to $p_{pc}$ in the continuous pump embodiment is $(\frac{1}{4})p_{eff}/(1-\eta_p)$. In the embodiment of FIG. 10, with a pump coupling ratio of 0.42, the steady-state pump power is 0.57 times $p_{eff}$. In an experimental set up used to test the present invention, the gate generator 156 was adjusted to provide a pulse width of between 1 millisecond and 3 milliseconds. The pump pulses generated by the pulse generator 154 had widths of 930 nanoseconds and were spaced apart by 2.78 microseconds corresponding to ¼ $t_{delay}$ and ¾ $t_{delay}$ for a delay time in the loop 130 of approximately 3.72 microseconds. Using this modulation, the measured effective pump power $P_{eff}$ was 1.08 watts, corresponding to coupling ratios $\eta_p=0.42$ and $\eta_s=0.65$. This corresponds to a theoretical value of approximately 530 milliwatts for the steady state power $p_{pc}$ for the same coupler ratios. This is in general agreement with the calculated required peak power (i.e., 530 milliwatts×1/0.57=922 milliwatts. A 3 millisecond delay, corresponding to more than 800 recirculations in the loop 130 and thus corresponding to an optical fiber path longer than 600 kilometers, was obtained with a pump source having a 3 percent r.m.s. power stability. It is believed that additional recirculations can be obtained by using a power supply with greater stability.

We claim:

1. A fiber optic recirculating memory, comprising:
   a length of optical fiber for receiving an optical signal pulse, said fiber forming a loop;
   a coupler, having a coupling ratio, for coupling said optical signal pulse to said loop to provide a circulating optical signal pulse which makes plural circulations in said loop, said coupler additionally outputting a portion of said circulating signal pulse from said loop on each of said plural circulations to provide a series of output pulses; and
   a light source for generating an input pump signal comprising a series of pump pulses, said coupler serially inputting each of said pump pulses to said fiber loop to circulate therein and optically pump said optical fiber to generate photons in said loop for amplification of said circulating optical signal pulse during each of said plural circulations of said signal pulses, the optical wavelength of said pump pulses and said optical single pulse selected such that said photons have the same optical wavelength as said optical signal pulse, the coupling ratio of said coupler greater than zero for said pump pulses such that each of said pump pulses makes plural circulations in said loop, the length of said loop providing a loop transit time for said pump pulses such that each of said pump pulses of said series of pump pulses makes plural circulations in said loop before overlapping with any subsequent pump pulse in said series of pump pulses to allow the amplitude of said pump pulses to decay prior to said overlapping and thereby reduce phase noise effects in said loop.

2. The fiber optic recirculating memory as defined in claim 1, wherein said pump pulses are equally spaced and have the same time duration so that said pump signal is periodic, the period of said pump signal being less than the amount of said loop transit time.

3. The fiber optic recirculating memory as defined in claim 2, wherein said time duration of each of said pump pulses is substantially less than said loop transit time.

4. The fiber optic recirculating memory as defined in claim 3, wherein said period of said pump signal is substantially equal to an integer multiple of the time duration of each said pump pulse.

5. The fiber optic recirculating memory as defined in claim 4, wherein the sum of the period and the time duration is substantially equal to said loop transit time.

6. A method of producing a series of output pulses, comprising the steps of:
   providing a loop comprised of a length of optical fiber, said loop having a loop length;
   coupling an optical signal pulse having an optical signal wavelength into said loop to circulate plural times in said loop, said circulating optical pulse propagating around said loop in a signal pulse loop propagation time determined by said optical signal wavelength and said loop length;
   tapping a portion of said circulating signal pulse from said loop on each of the circulations to provide said series of output pulses;
   coupling a series of input pump pulses having an optical pump wavelength into said loop of fiber to pump said fiber to generate photons in the loop at said optical signal wavelength for amplification of said circulating signal pulse during each of said plural circulations, said pump pulses propagating around said loop in a pump wavelength and said loop length, said input pump pulse having a pump pulse time duration; and
   spacing each pump pulse apart in time from the next succeeding pump pulse in said series of pump pulses so that each pump pulse makes plural circulations in said loop before overlapping with any subsequent pump pulse to allow the amplitude of each of said pump pulses to decay prior to said overlapping, thereby reducing phase noise effects in said loop.

7. The method defined in claim 6, wherein said pump pulses are spaced apart in time by a selected time delay so that said pump pulses are periodic, said method additionally comprising the step of selecting said time delay so that said pump pulse has a period smaller than said pump pulse loop propagation time.

8. The method defined in claim 7, additionally comprising the step of selecting said pump pulse time duration of each pump pulse to be substantially smaller than said pump pulse loop propagation time.

9. The method defined in claim 8, additionally comprising the step of selecting said period of said pump pulses to be substantially equal to an integer multiple of said pump pulse time duration.

10. The method defined in claim 9, additionally comprising the step of selecting said pump pulse time duration and said pump pulse period so that said sum of said pump pulse period and said pump pulse time duration is substantially equal to said pump pulse loop propagation time.

11. In a fiber optic recirculating memory device having a loop comprised of optical fiber, a method of pumping said memory device to cause amplification of a signal propagating in said loop, said method comprising:
   inputting a series of pump pulses into said loop for recirculation therein;
   utilizing said pump pulses to optically pump said optical fiber to generate photons in said loop to cause said amplification of said signal; and
   spacing each pump pulse apart in time from the next succeeding pump pulse so that each pump pulse makes plural circulations in said loop before overlapping with any subsequent pump pulse.

* * * * *

UNITED STATES PATENT AND TRADEMARK OFFICE
CERTIFICATE OF CORRECTION

PATENT NO. : 4,738,503
DATED : April 19, 1988
INVENTOR(S) : Desurvire et al.

It is certified that error appears in the above-identified patent and that said Letters Patent is hereby corrected as shown below:

Column 9, line 44, change "to the power" to --of the power--.
Column 9, line 45, change "D of the" to --D to the--.

Column 15, line 61, change "where $\phi_p$" to --where $\eta_p$--.

Column 16, line 11, change "(6)" to --(5)--.

Column 17, line 60, change "power Pp" to --power Ppc--.

Column 20, line 36, change "loop 105" to --loop 106--.

Column 23, line 2, change "to por5 4" to --to port 4--.

On the title page, item [57] ABSTRACT, line 12, change "and a pump power" to --and pump power--

Signed and Sealed this

Sixth Day of August, 1991

Attest:

HARRY F. MANBECK, JR.

Attesting Officer      Commissioner of Patents and Trademarks